United States Patent
Lim et al.

(10) Patent No.: US 6,339,238 B1
(45) Date of Patent: Jan. 15, 2002

(54) FERROELECTRIC FIELD EFFECT TRANSISTOR, MEMORY UTILIZING SAME, AND METHOD OF OPERATING SAME

(75) Inventors: Myoungho Lim; Vikram Joshi; Joseph D. Cuchiaro; Larry D. McMillan; Carlos A. Paz de Araujo, all of Colorado Springs, CO (US)

(73) Assignee: Symetrix Corporation, Colorado Springs, CO (US)

( * ) Notice: Subject to any disclaimer, the term of this patent is extended or adjusted under 35 U.S.C. 154(b) by 0 days.

(21) Appl. No.: 09/329,670

(22) Filed: Jun. 10, 1999

Related U.S. Application Data

(63) Continuation-in-part of application No. 09/170,590, filed on Oct. 13, 1998.

(51) Int. Cl.$^7$ .............................................. H01L 29/72
(52) U.S. Cl. ...................................... 257/295; 257/296
(58) Field of Search ................................ 257/295, 296

(56) References Cited

U.S. PATENT DOCUMENTS

| | | |
|---|---|---|
| 2,791,758 A | 5/1957 | Looney |
| 2,791,759 A | 5/1957 | Brown |
| 2,791,760 A | 5/1957 | Ross |
| 2,791,761 A | 5/1957 | Morton |
| 2,876,436 A | 3/1959 | Anderson |
| 4,873,664 A * | 10/1989 | Eaton .......................... 257/295 |
| 4,888,733 A | 12/1989 | Mobley |
| 5,303,182 A | 4/1994 | Nakao et al. |
| 5,361,224 A | 11/1994 | Takasu |
| 5,361,225 A | 11/1994 | Ozawa |
| 5,365,094 A | 11/1994 | Takasu |
| 5,382,539 A | 1/1995 | Nakamura |
| 5,449,935 A | 9/1995 | Nakamura |
| 5,515,311 A | 5/1996 | Mihara |
| 5,523,964 A | 6/1996 | McMillan et al. |
| 5,541,870 A | 7/1996 | Mihara et al. |
| 5,541,871 A | 7/1996 | Nishimura et al. |
| 5,541,873 A | 7/1996 | Nishimura et al. |
| 5,559,733 A | 9/1996 | McMillan et al. |
| 5,563,081 A | 10/1996 | Ozawa |
| 5,744,374 A | 4/1998 | Moon |
| 5,768,185 A | 6/1998 | Nakamura et al. |
| 5,959,879 A | 9/1999 | Koo |

FOREIGN PATENT DOCUMENTS

| | | |
|---|---|---|
| EP | 0 869 557 A2 | 10/1998 |
| JP | 4-256361 | 9/1992 |
| JP | 11-17127 | 1/1999 |
| WO | WO96/13860 | 5/1996 |

OTHER PUBLICATIONS

Hiroshi Ishiwara, "Current Status and Prospects of FET-—Type Ferroelectric Memories," DRCC Device Research Conference, p. 6–9 (Jun. 21–23, 1999).

Hiroshi Ishiwara, talk presented in Japan (Jul., 1999).

Auciello et al., "The Physics of Ferroelectric Memories," Physics Today, American Institute of Physics (Woodbury, NY), vol. 51 (No. 7), p. 22–27 (Jul. 1998).

(List continued on next page.)

*Primary Examiner*—Edward Wojciechowicz

(57) ABSTRACT

A ferroelectric non-volatile memory in which each memory cell consists of a single electronic element, a ferroelectric FET. The FET includes a source, drain, gate and substrate. A cell is selected for writing or reading by application of bias voltages to the source, drain, gate or substrate. A gate voltage equal to one truth table logic value and a drain voltage equal to another truth table logic value are applied via a row decoder, and a substrate bias equal to a third truth table logic value is applied via a column decoder to write to the memory a resultant Ids logic state, which can be non-destructively read by placing a voltage across the source and drain.

24 Claims, 15 Drawing Sheets

OTHER PUBLICATIONS

Hirai et al., "Formation of Metal/Ferroelectric/Insulator/Semiconductor Structure with a CeO2 Buffer Layer," Jpn. J. Appl. Phys., vol. 33 (No. 9B), p. 5219–5221 (Sep. 1994).

Hirai et al., "Characterization of Metal/Ferroelectric/Insulator/Semiconductor Structure with CeO2 Buffer Layer," Jpn. J. Appl. Phys., vol. 34 (No. 8A0, p. 4163–4166 (Aug. 1995).

Kim et al., "Memory window of Pt/SrBi2Ta2O9/CeO2/SiO2/Si structure for metal ferroelectric insulator semiconductor field effect transistor," Appl. Phys. Lett., American Institute of Physics, vol. 71 (No. 24), p. 3507–3509 (Dec. 15, 1997).

Nakamura et al., "Preparation of Pb(Zr,Ti)O3 thin films on electrodes including IrO2,", Appl. Phys. Lett., American Institute of Physics, vol. 65 (No. 12), p. 1522–1524 (Sep. 19, 1994).

Scott et al., "Integrated Ferroelectrics," Condensed Matter News, vol. 1 (No. 3), p. 16–20 (Jun. 1992).

Shin et al., "A Proposal of Pt/SrBi2Ta2O9/CeO2/Si Structure for Non Destructive Read Out Memory Devices," Extended Abstracts of the 1997 International Conference on Solid State Devices and Materials, p. 32–33 (Jun. 1997).

Shu–Yau Wu, "A New Ferroelectric Memory Device, Metal–Ferroelectric–Semiconductor Transistor," IEEE Transactions on Electron Devices, vol. ED–21 (No. 8), p. 499–504 (Aug. 1974).

S.Y. Wu, "Memory Retention and Switching Behavior of Metal–Ferroelectric–Semiconductor Transistors," Ferroelectrics, Gordon and Breaeh Science Publishers, Ltd. (Great Britain), p. 379–383 (Jun. 1976).

* cited by examiner

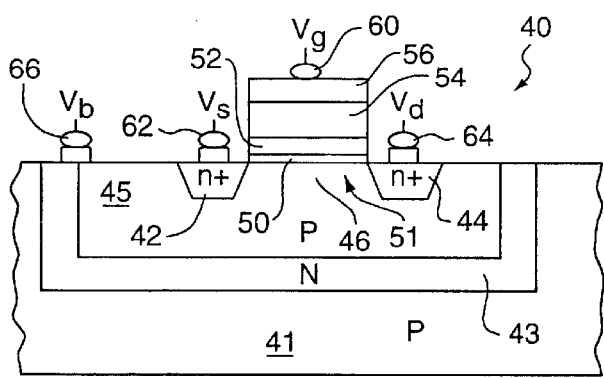
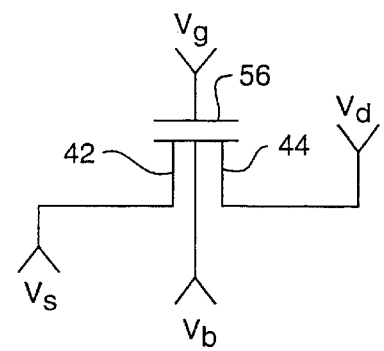
FIG. 1          FIG. 2
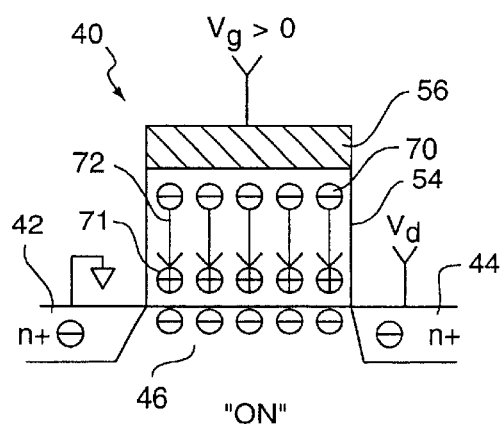
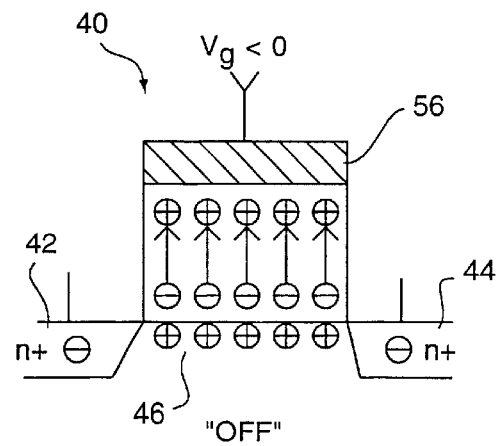
FIG. 3          FIG. 4
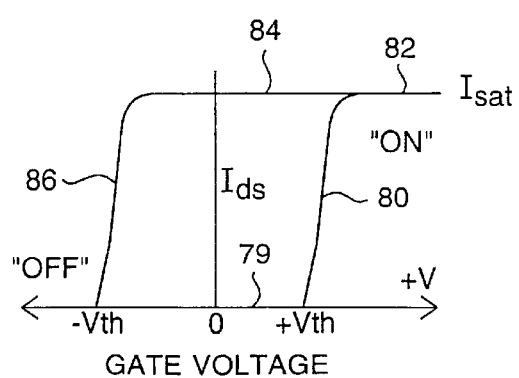
FIG. 5

FERROELECTRIC FIELD EFFECT TRANSISTOR, MEMORY UTILIZING SAME, AND METHOD OF OPERATING SAME

This application is a continuation-in-part of U.S. patent application Ser. No. 09/170,590 filed Oct. 13, 1998.

BACKGROUND OF THE INVENTION

1. Field of the Invention

This invention relates to ferroelectric field effect transistors, and more particularly to ferroelectric memories utilizing such transistors and methods of operating such transistors and memories.

2. Statement of the Problem

It has been known since at least the 1950's that if a practical ferroelectric memory could be made, it would provide a fast, dense, non-volatile memory that could be operated at relatively low voltages. See Orlando Auciello, et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. However, it has been postulated for at least 40 years that it may be possible to design a memory in which the memory element is a ferroelectric field effect transistor (FET), which memory could be non-destructively read. See Shu-Yau Wu, "A New Ferroelectric Memory Device, Metal-Ferroelectric-Semiconductor Transistor", in *IEEE Transactions On Electron Devices*, pp. 499–504, August 1974; S. Y. Wu, "Memory Retention and Switching Behavior Of Metal-Ferroelectric-Semiconductor Transistors", in *Ferroelectrics*, Vol. 11, pp. 379–383, 1976; and J. R. Scott, C.A. Paz De Araujo, and L. D. McMillan, "Integrated Ferroelectrics", in *Condensed Matter News*, Vol. 1, No. 3, pp. 15–20, 1992. Because the ferroelectric memory effect measured in the early devices of Wu was only a temporary, single state effect rather than a long lived two state effect, it is now believed that this effect was charge injection effect rather than an effect due to ferroelectric switching. However, recently a metal-ferroelectric-insulator-semiconductor FET device, i.e. a MFISFET, has been reported that appears to show true ferroelectric memory behavior. See Tadahiko Hirai, et al., "Formation of Metal/Ferroelectric/Insulator/Semiconductor Structure With A $CeO_2$ Buffer Layer", in *Japan Journal of Applied Physics*, Vol. 33, Part I, No. 9B, pp. 5219–5222, September 1994; Tadahiko Hirai, et al., "Characterization of Metal/Ferroelectric/Insulator/Semiconductor Structure With A $CeO_2$ Buffer Layer", in *Japan Journal of Applied Physics*, Vol. 34, Part I, No. 8A, pp. 4163–4166, August 1995; Yong Tae Kim, et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, Dec. 15, 1997, pp. 3507–3509; and U.S. Pat. No. 5,744,374 issued Apr. 28, 1998 to Jong Moon.

To make a memory requires not only a memory element, but also a means for addressing a large number of memory elements. Initially, it was believed that a ferroelectric memory element might be addressed by a simple array of rows and columns of conductors. A ferroelectric memory element, it was thought, could be located at each of the junctures of the array and addressed by applying a voltage to the conductors for the corresponding row and column. It was believed that if the voltage on each conductor was less than the threshold voltage for ferroelectric switching (coercive voltage) and the voltage difference between the conductors was greater than the coercive voltage, then only the selected cell would be written to or read, and the other cells would remain unchanged. However, it was found that this did not work because the neighboring unselected cells were disturbed by the voltages on the address lines. Thus, a switch was added between one of the address lines and each ferroelectric memory element. See U.S. Pat. No. 2,876,436 issued on Mar. 3, 1959 to J. R. Anderson and U.S. Pat. No. 4,873,664 issued on Oct. 10, 1989 to S. Sheffield Eaton, Jr. If the switch is a transistor as in the latter patent, the memory assumes a memory address architecture essentially the same as that of a conventional DRAM. However, when applied to a ferroelectric memory, even this architecture disturbed the memory cells attached to the same plate line as the addressed cell. That is, it has been found that ferroelectric materials do not have a sharp coercive threshold voltage, but rather even a small voltage will cause the ferroelectric to partially switch and, therefore, the repetitive application of small disturb voltages, such as occur in a conventional memory array, eventually causes the change or loss of a memory state. Therefore, a more complex architecture was proposed to overcome this disturb. See, for example, U.S. Pat. No. 4,888,733 issued on Dec. 19, 1989 to Kenneth J. Mobley.

The above address schemes are all for a NVFRAM; that is, a memory utilizing a ferroelectric capacitor as a memory element, rather than for a memory utilizing a ferroelectric FET. Insofar as known to applicants, the only address architecture disclosed up to now for a memory in which the memory element is a ferroelectric FET is shown in FIG. 1 of U.S. Pat. No. 5,523,964 issued on Jun. 4, 1996 to McMillan, et al. Like the Mobley, et al., architecture, to avoid the disturb problem, this architecture is relatively complex, utilizing five transistors in each memory cell in addition to the ferroelectric FET. Such complex architecture results in a memory that is much less dense and slower than, for example, a conventional DRAM. Thus, it appears that the fact that the ferroelectric material does not have a sharp coercive field threshold and can be switched by repetitive applications of a small voltage has made several of the original objectives of research into ferroelectric memories unattainable. It would, therefore, be highly desirable to provide a simpler architecture and method for addressing a ferroelectric memory.

SUMMARY OF THE INVENTION

The invention solves the above problem by providing a method and apparatus for addressing a ferroelectric memory in which there are no additional electric elements in the individual memory cell; that is, it provides an architecture in which each memory cell preferably contains only the ferroelectric memory element, e.g. the ferroelectric FET.

A memory cell can be written to by applying an electrical pulse to the gate and an electrical bias between another two electrical elements of the cell.

In the preferred embodiment, the ferroelectric memory element is a ferroelectric FET and a write bias is applied between the substrate and a FET source/drain.

In one preferred embodiment, a source/drain of all cells in an array are held at a common voltage and the substrate voltage is used to select the cells to be written to. Preferably, the drain voltage is used to select which logic state is to be written to an individual cell.

A truth table provides a unique drain to source current for each combination of write bias with the pulse on the gate. A unique logic state is associated with the unique drain to source current.

Preferably, the cell is read by sensing the source/drain current when a voltage difference is placed across the source and drain.

New ferroelectric memory cell structures and fabrication processes are also provided to ensure that the substrate of each cell can be electrically isolated from the substrate of the other cells.

The invention provides a method of writing to a selected memory cell in a ferroelectric memory, the memory including a plurality of memory cells each containing a ferroelectric FET, each of the ferroelectric FETs having a first electrical element and a second electrical element, the ferroelectric FETs arranged in an array comprising a plurality of rows and a plurality of columns of the ferroelectric FETs, the memory further including a plurality of first row lines, each of the first row lines running parallel to one of the rows of the ferroelectric FETs, and a plurality of column lines, each of the column lines running parallel to one of the columns of ferroelectric FETs, the method comprising placing a first voltage on the one of the row lines running parallel to the one of the rows containing the selected memory cell, placing a second voltage on the one of the columns running parallel to the selected memory cell, applying the first voltage to the first electrical element in each of the ferroelectric FETs in the row containing the selected memory cell, and applying the second voltage to the second electrical element in each of the ferroelectric FETs in the column containing the selected memory cell. Preferably, the first electrical element is the source of the FETs. Preferably, the first electrical element is the substrate of the FETs. Preferably, the first electrical element is the drain of the FETs. Preferably, the second electrical element is the source of the FETs. Preferably, the second electrical element is the substrate of the FETs. Preferably, the second electrical element is the gate of the FETs. Preferably, the second electrical element is the drain of the FETs. Preferably, the second electrical element is the gate of the FETs. Preferably, the first electrical element is the gate of the FETs. Preferably, the second electrical element is the substrate of the FETs. Preferably, each of the ferroelectric FETs include a third electrical element and the memory further includes a plurality of second row lines, each of the second row lines running parallel to one of the rows of the ferroelectric FETs, and the method further comprises placing a third voltage on the one of the second row lines running parallel to the row containing the selected memory cell and applying the third voltage to the third electrical element in each of the ferroelectric FETs in the row containing the selected memory cell. Preferably, the third electrical element is the drain of the FETs. Preferably, each of the ferroelectric FETs include a third electrical element and the memory further includes a plurality of second row lines, each of the second row lines running parallel to one of the rows of the ferroelectric FETs, and the method further comprises placing a third voltage on the one of the second row lines running parallel to the row containing the selected memory cell and applying the third voltage to the third electrical element in each of the ferroelectric FETs in the row containing the selected memory cell.

The invention also provides a method of reading a ferroelectric memory including a plurality of ferroelectric FETs, the method comprising the steps of: sensing a first current through an electrical element of a first one of the FETs; sensing a second current through an electrical element of a second one of the FETs, the first current being greater than the second current; and associating a first logic state with the first current and a second logic state with the second current. Preferably, the method further comprises the steps of sensing a third current through an electrical element of a third one of the FETs, the third current being of opposite sign to the first current; and associating the second logic state with the third current. Preferably, the electrical element is either the source or the drain of the FET.

In addition, the invention provides a method of reading a ferroelectric memory including a plurality of ferroelectric FETs, the method comprising the steps of: sensing a first current through an electrical element of a first one of the FETs; sensing a second current through an electrical element of a second one of the FETs, the second current being of opposite sign to the first current; and associating a first logic state with the first current and a second logic state with the second current.

The invention further provides a ferroelectric memory, the memory including a plurality of memory cells each containing a ferroelectric FET, each of the ferroelectric FETs having a first electrical element and a second electrical element, the ferroelectric FETs arranged in an array comprising a plurality of rows and a plurality of columns of the ferroelectric FETs, the memory further including a plurality of first row lines, each of the first row lines running parallel to one of the rows of the ferroelectric FETs, and a plurality of column lines, each of the column lines running parallel to one of the columns of ferroelectric FETs, each of the first row lines electrically connected to the first electrical element in one of the rows of ferroelectric FETs, and each of the column lines electrically connected to the second electrical element in one of the columns of ferroelectric FETs. Preferably, the first electrical element is the source of the FETs. Preferably, the first electrical element is the substrate of the FETs. Preferably, the first electrical element is the drain of the FETs. Preferably, the second electrical element is the source of the FETs. Preferably, the second electrical element is the substrate of the FETs. Preferably, the second electrical element is the gate of the FETs. Preferably, the second electrical element is the drain of the FETs. Preferably, the second electrical element is the gate of the FETs. Preferably, the first electrical element is the gate of the FETs. Preferably, the second electrical element is the substrate of the FETs. Preferably, each of the ferroelectric FETs include a third electrical element and the memory further includes a plurality of second row lines, each of the second row lines running parallel to one of the rows of the ferroelectric FETs, each of the second row lines electrically connected to the third electrical element in one of the rows of ferroelectric FETs. Preferably, the third electrical element is the drain of the FETs. Preferably, each of the ferroelectric FETs include a third electrical element and the memory further includes a plurality of second row lines, each of the second row lines running parallel to one of the rows of the ferroelectric FETs, each of the second row lines electrically connected to the third electrical element in one of the rows of ferroelectric FETs.

In a further aspect, the invention provides a ferroelectric memory comprising a plurality of ferroelectric FETs arranged in a plurality of rows and a plurality of columns; a row decoder electrically connected to a first electrical element of each of the ferroelectric FETs; and a column decoder electrically connected to a second electrical element of each of the ferroelectric FETs. Preferably, the first electrical element is the gate of each FET and the second electrical element is the substrate of each FET. Preferably, the first electrical element is the substrate of each FET and the second electrical element is the gate of each FET. Preferably, the first electrical element is the gate of each FET and the second electrical element is the drain of each FET. Preferably, the first electrical element is the drain of each FET and the second electrical element is the substrate of each FET. Preferably, the first electrical element is the substrate of each FET and the second electrical element is the drain of each FET. Preferably, the ferroelectric FET comprises a FET selected from the group consisting of: a MFISFET, a MFMISFET, and a MFSFET.

In still a further aspect, the invention provides a ferroelectric memory comprising a memory array comprising a plurality of rows and columns of memory cells wherein each of the memory cells consisting essentially of a single electrical component, the single electrical component consisting essentially of a ferroelectric FET. Preferably, the ferroelectric FET comprises a FET selected from the group consisting of: a MFISFET, a MFMISFET, and a MFSFET. Preferably, the memory further includes a row decoder for addressing the rows and a column decoder for addressing the columns.

In still another aspect, the invention provides a ferroelectric memory comprising a first ferroelectric FET having a first semiconducting substrate and second ferroelectric FET having a second semiconducting substrate, the memory further including a substrate insulator insulating the first semiconducting substrate from the second semiconducting substrate. Preferably, the memory comprises an array of rows and columns of the ferroelectric FETs, each of the FETs having a semiconducting substrate, and the insulator insulates each of the semiconducting substrates from all of the other semiconducting substrates. Preferably, the memory further includes an electrical contact to each of the semiconducting substrates. Preferably, the memory includes a plurality of wells in the insulator and the contact comprises a conductive layer in each of the wells.

In yet another aspect, the invention provides a ferroelectric memory cell comprising: a semiconducting substrate, a first well formed in the substrate; a second well formed in the first well; and a ferroelectric FET, a portion of which is formed in the second well; the first well and the second well comprising different semiconductor types. Preferably, the first semiconductor type is n-type semiconductor and the second semiconductor type is p-type semiconductor. Preferably, the portion of the FET formed is the second well comprises a source/drain.

In still a further aspect, the invention provides a method of writing to a selected memory cell in a ferroelectric memory comprising a plurality of memory cells, each of the memory cells comprising a ferroelectric FET comprising a substrate, a gate, a source/drain, and a channel, the substrate and the source/drain forming a junction diode having a threshold voltage, the method comprising the step of forward biasing the junction diode whereby the voltage at the channel essentially comprises the threshold voltage of the junction diode. Preferably, the threshold voltage ranges from 0.2 volts to 0.7 volts.

In a further aspect, the invention provides a method of writing to a selected memory cell in a ferroelectric memory comprising a plurality of memory cells, each of the memory cells comprising a ferroelectric FET comprising a substrate, a gate, a source/drain, and a channel, the substrate and the source/drain forming a junction diode having a threshold voltage, the method comprising the step of reverse biasing the junction diode whereby the voltage at the channel is essentially unaffected by a voltage applied to the source/drain.

The invention not only provides a simpler and much more dense ferroelectric memory, but also provides one that can be manufactured easily. Numerous other features, objects and advantages of the invention will become apparent from the following description when read in conjunction with the accompanying drawings.

BRIEF DESCRIPTION OF THE DRAWINGS

FIG. 1 shows cross-sectional view of a preferred embodiment of a ferroelectric FET according to the invention illustrating the various electrical contacts associated with the FET;

FIG. 2 is an equivalent circuit diagram of the ferroelectric FET of FIG. 1;

FIG. 3 illustrates the state of polarization of the ferroelectric material and the resulting channel state for the FET of FIG. 1 for the "ON" state;

FIG. 4 illustrates the state of polarization of the ferroelectric material and the resulting channel state for the FET of FIG. 1 for the "OFF" state;

FIG. 5 illustrates a graph of drain to source current versus gate voltage for an idealized ferroelectric FET;

DETAILED DESCRIPTION OF THE PREFERRED EMBODIMENT

1. Introduction

Figure 6:
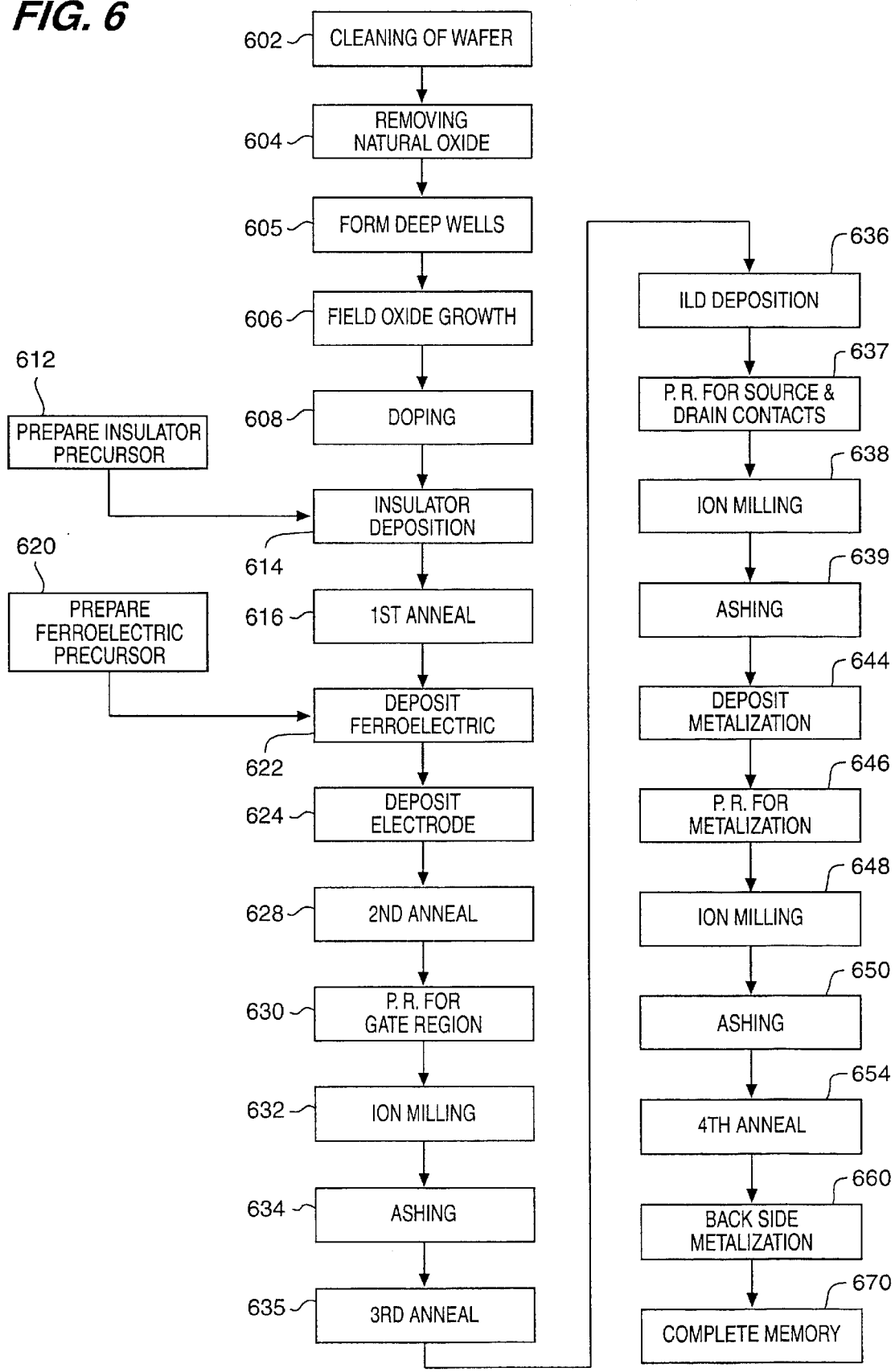
FIG. 6 is a flow chart of a preferred process for fabricating the ferroelectric FET of FIG. 1.
Figure 7:
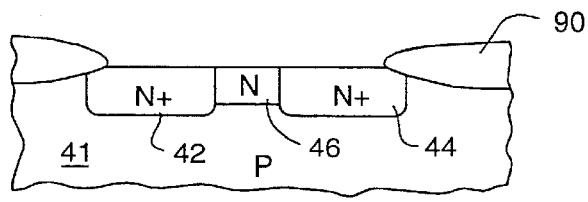
FIGS. 7–12 are cross-sectional views of a ferroelectric FET according to the invention in progressive stages of fabrication.

Directing attention to FIG. 1, a cross-sectional view of a portion of a ferroelectric FET 40 according to the invention is shown. The FET 40 includes a substrate 41 which is preferably p-type silicon. A deep n-well 43 is formed in substrate 41, and a less deep p-well 45 is formed within the n-well. Highly doped areas 42 and 44, preferably n-type, are formed in the p-well 45. We shall refer to these doped areas 42 and 44 herein as source/drains since they can either be a source or a drain depending on the relative voltages applied to the areas. A channel region 46, preferably also n-type but not as highly doped as source/drains 42 and 44, is formed between the source/drains 42 and 44. An insulating layer 51 is preferably formed on substrate 41 above channel region 46. As will be discussed in more detail below, in the preferred embodiment, insulating layer 51 comprises layers 50 and 52, each of which is a different insulator. A ferroelectric layer 54 is formed above channel 46, preferably on insulator 52, and a gate electrode 56 is formed on ferroelectric 54. Wiring layers form electrical contacts 60, 62, 64 and 66 to gate 56, source/drain 42, source/drain 64, and substrate 41, respectively. Contact 66 is preferably located over the junction between deep n-well 43 and p-well 45. As will be described in more detail below, a key feature of the invention is that the cell is written to by applying an electrical bias, Vb, to substrate 41 via contact 66. In the portions of this disclosure which discuss the design and operation of a memory array utilizing a ferroelectric FET, such as 40, according to the invention, the voltage Vb is referred to as signal SB.

It should be understood that the FIGS. 1, 3–4, 7–12 and 28–36 depicting integrated circuit devices are not meant to be actual plan or cross-sectional views of any particular portion of an actual integrated circuit device. In the actual devices, the layers will not be as regular and the thickness may have different proportions. The figures instead show idealized representations which are employed to more clearly and fully depict the structure and process of the invention than would otherwise be possible.

FIG. 2 shows the equivalent circuit for the preferred embodiment of the ferroelectric FET of FIG. 1. A voltage Vs, which, in the preferred embodiment of the write process, can include an open state, and, in the preferred embodiment of the read process can be ground or a small positive voltage, is applied to source 42. Voltage, Vb, preferably used to select and deselect the cell, is applied to the substrate 41. A drain bias voltage, Vd, is applied to drain 44. In the preferred write process this voltage is generally the logic "0" voltage (zero volts or ground) or the logic "1" voltage, e.g. 5 volts, and in the read process it is either zero or a small positive voltage. A gate bias voltage, Vg, is applied to gate 56. In the write process this is either the logic "0" voltage (zero volts or ground) or the logic "1" voltage, e.g. 5 volts, and in the read process it is either zero or a small positive voltage. Both Vd and Vg are also used to select and deselect the cell.

FIG. 3 illustrates the state of polarization of the ferroelectric material 54 and the resulting state of channel 46 for the FET 40 for the "ON" state, while FIG. 4 illustrates the state of polarization of the ferroelectric material 54 and the resulting state of channel 46 for the FET 40 for the "OFF" state. For sake of clarity, the insulating material(s) are not shown in these figures. In these figures, the circles with minus signs, such as 70, represent electrons, the circles with plus signs, such as 71, represent positive ions or vacancies, and the arrows, such as 72, represent the direction of polarization charge. If the an electric field is applied to the FET 40 in the upward direction in the figures, that is, if a positive voltage is applied to gate 56, then the ferroelectric material 54 will develop a polarization as shown in FIG. 3. Preferably, this gate voltage is in the range from about 1 volt to 15 volts, and most preferably in the range of about 3–5 volts. If the voltage is equal to or greater than the coercive voltage, essentially all the ferroelectric domains in the material 54 will become polarized as shown, but even a small voltage, e.g. 1.0 volt or higher, will cause some domains to switch. The positive polarization charge above the channel 46 will induce electrons into the channel, which, since electrons are the carriers in the n-type material, will greatly increase the conductivity of the channel. Assuming a drain bias, Vd, preferably in the range of about 0.5 Volts to 8 volts, the increased conductivity of channel 46 will result in a greatly increased drain to source current, which is sensed to detect the "ON" state, which we will arbitrarily call a logic "1 " state herein. If an electric field is applied to the FET 40 in the downward direction in the figures, that is, if a negative voltage is applied to gate 56, then the ferroelectric material 54 will develop a polarization as shown in FIG. 3. The negative polarization charge above the channel 46 will induce a positive charge into the channel, which depletes the carriers in the n-type material, and will greatly decrease the conductivity of the channel. Assuming a drain bias, Vd, the decreased conductivity of channel 46 will result in a greatly decreased drain to source current, which is sensed to detect the OFF state, which we will arbitrarily call a logic "0" state herein.

FIG. 5 shows an idealized hysteresis curve, i.e. a graph of gate voltage versus drain current, of a ferroelectric FET, such as 40. Starting at a zero gate voltage, there is essentially no drain current, because the resistance in the channel 46 is very high. As the gate voltage increases, there remains no drain current until a positive threshold voltage, +Vth, is reached. At this voltage, the ferroelectric 56 switches into the ON state and attracts carriers into the channel 46 causing a drain current. Then, as the gate voltage continues to increase, the drain current increases linearly along curve 80 until a saturation current is approached. After saturation, as the gate voltage increases, there is no increase in current, and the curve continues flat along line 82. As the gate voltage is decreased, the drain current remains the same until a negative threshold voltage, −Vth, is approached. Then the drain current decreases linearly along curve 86 until it approaches the point where the ferroelectric switches into the OFF state, at which point the drain current goes to zero. The drain current remains at zero no matter how large a negative voltage is applied, and, as the voltage is increased, does not rise above zero until the positive threshold voltage is reached.

The area between lines 79, 80, 84, and 86 is called the "memory window". To obtain a workable memory device, the width of the memory window, i.e. +Vth−−Vth, must be greater than the noise in the gate electrode 56, and the height of the memory window, i.e. Isat, must be greater than the noise in the drain and associated sense circuit. For a non-volatile memory, the zero volts line should ideally be centered in the memory window, or at least well within the noise margins, since the device should retain the data without external power. A high ratio of Ids in the ON state and Ids in the OFF state is also desirable to permit ease of discrimination of the two states by the sensing circuit.

2. The Fabrication Process

A flow chart showing the steps of a preferred process for fabricating a memory 800 (FIG. 38) including the FET 40 (FIG. 1) according to the invention is shown in FIG. 6, and a FET 40 in progressive stages of fabrication is shown in FIGS. 7–12. The word "substrate" is often used ambiguously in the art. It can mean the underlying wafer 41 on which an integrated circuit is formed as well as any object on which a thin film layer is deposited. In this disclosure, "substrate" shall mean the object to which the layer of interest is applied; for example, when we are talking about a ferroelectric layer, such as 54, the substrate includes the layers 41, 50 and 52 on which the ferroelectric layer is formed. In the art, the word "precursor" can mean a solution containing one metal which is mixed with other "precursors" to form the solution to be applied to the substrate, or the solution which is applied to a substrate. In this discussion, we shall generally refer to the individual precursors that are mixed to form the solution that is applied to the substrate as "initial precursors" and the precursor as applied to the substrate as the "final precursor" or just "precursor", unless the meaning is clear from the context. In intermediate stages, the solution may be referred to as the "intermediate precursor". The term "thin film" is used herein as it is used in the integrated circuit art. Generally, it means a film of less than a micron in thickness. The thin films disclosed herein are in all instances 0.5 microns in thickness or less. These thin films of the integrated circuit art should not be confused with the so called "thin films" in layered capacitors of the macroscopic capacitor art which are formed by a wholly different process which is incompatible with the integrated circuit art.

In step 602, a wafer 41 is provided and cleaned to remove contaminants, preferably by dipping the wafer into $H_2SO_4$ for 30 minutes. Then, in step 604, the wafer is dipped into 10:1 BOE for five minutes, which removes any natural oxide that may have formed on the wafer. The deep wells 43 and 45 are then formed in step 605 in a conventional manner, such as by diffusion. These deep wells are not shown in FIGS. 7–12 so that the entire process can be illustrated on one sheet of drawing. In step 606, field oxide 90 (FIG. 7) is grown in a furnace, preferably to a thickness of 500 nanometers (nm). As known in the art, this process also serves to drive in the deep wells. The source/drain regions 44 and 46 and the channel region 46 are then formed by a conventional doping method in step 608. This includes the usual photo resist, etching and strip steps for removal of the field oxide followed preferably by a phosphorous diffusion step. Preferably, the doping of channel region 46 is in the range of $2\times10^{15}$ to $10^{17}$ atoms/cm$^3$, and most preferably in the range $10^{16}$ to $10^{17}$ atoms/cm$^3$, which provides a resistance of about 1 ohm to 5 ohms. Preferably, the doping of the source/drain regions is in the range of $10^{19}$ to $10^{20}$ atoms/cm$^3$.

In steps 612 and 620, the initial precursors for depositing the insulator 52 and the ferroelectric 54, respectively, are formed. These may be formed by interacting each of the metals, e.g., cerium for the insulator and strontium, bismuth and tantalum for the ferroelectric, or an alkoxide of the metal with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, -octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1,3,5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction.

In the preferred embodiment, cerium oxide, $CeO_2$, is used as insulator 52. For the FETs for which experimental results are presented below, a commercially available cerium 2-ethylhexanoate in 2-ethylhexanoic acid was used, i.e. 12.08 weight percent Ce available from Strem Company (Lot No. 136599-S). An amount of this solution equal to 23.2042 grams was weighed into a 125 ml (milliliter) Erlenmeyer flask and 75 ml of n-octane was added. This was stirred at room temperature to dissolve the cerium compound in the n-octane, which formed a pale yellow solution immediately. Next, this solution was poured into a 250 ml graduated cylinder and diluted to 200.0 ml with additional n-octane. This solution was then filtered through a 0.2 micron filter into a 250 ml bottle to form the final cerium precursor. Other insulators may be used, such as yttrium oxide and lanthanum oxide.

In the preferred embodiment, a layered superlattice material, such as described in U.S. Pat. No. 5,519,234 issued May 21, 1996 to Carlos A. Paz de Araujo, et al., and U.S. Pat. No. 5,434,102 issued on Jul. 18, 1995 to Watanabe, et al., is used. The typical precursor for making layered superlattice materials currently preferred by those skilled in the art has the stoichiometric formula $SrBi_{2.18}Ta_{1.44}Nb_{0.56}O_9$. This precursor includes about 9% excess bismuth. That is, the standard stoichiometric formula includes an amount of bismuth above what is required to bond with all the strontium, tantalum and niobium in the precursor to form a layered superlattice compound with all atomic sites in the crystal occupied. As explained in the above patents, strontium is considered to be an "A-site" element in the above formula and tantalum and niobium are considered "B-site" elements, while the bismuth is the superlattice generator element. One feature of the invention is that a final layered superlattice compound with excess B-site and/or superlattice generator metals has a lower dielectric constant and is therefore preferred as the ferroelectric. A-site poor, that is, A-site deficient compounds, are preferred. Specifically, the most preferred materials are: strontium poor strontium bismuth tantalate; and strontium poor strontium bismuth tantalum niobate. Preferably, the strontium is present in a proportion of between 0.5 times to 1.0 times its normal stoichiometric concentration. In the experimental examples discussed below, however, strontium bismuth tantalate having the final formula $SrBi_2Ta_2O_9$ was used. The electrode 56 is preferably platinum, but may be other metals or conductors also.

Figure 8:
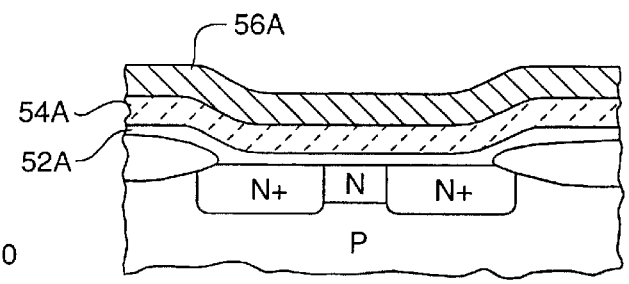

Turning to FIG. 8, the insulator thin film 52A and ferroelectric thin film 54A are preferably applied using a liquid deposition technique, such as spin-coating or a misted deposition method as described in U.S. Pat. No. 5,546,945 issued Oct. 10, 1995 to Larry D. McMillan, et al. In the examples discussed below, a spin-on technique was used to form the thin films. The technique of deposition, drying, and rapid thermal processing (RTP) as described in the above patents was performed for one layer of cerium oxide to form the insulator 52, while the same deposition technique for five layers was used to form the strontium bismuth tantalate. After deposition, drying and RTP, in step 616 the cerium oxide film 52A on the substrate was annealed at 800° C. for 1.5 hours in oxygen. The ferroelectric layer 54A was then deposited in step 622 as discussed above, and then electrode layer 56A was formed by sputtering platinum in step 624. The wafer was then annealed in a second anneal step 628 at 800° C. for one hour in oxygen.

Figure 9:
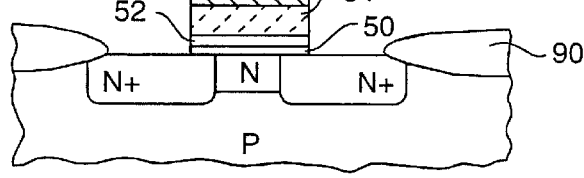

Proceeding to FIG. 9, the gate region 51 of the FET 40 is now patterned in steps 630, 632, and 634. Preferably, a photo resist (P.R.) is deposited in step 630, developed using a mask, then the electrode 56, ferroelectric 54 and insulator 52 are defined by ion milling in step 632 followed by ashing in step 634. The patterned gate region 51 is then annealed again in step 635 in an oxygen furnace at 800° C. for 30 minutes. In the annealings subsequent to the cerium oxide deposition, a natural oxide layer 50 is formed.

The relative thicknesses of the layers 50, 52, and 54, particularly 50 and 52, is important. Preferably, the natural oxide is from 2 nm to 8 nm thick, the insulator 52 is from 15 nm to 35 nm thick, and the ferroelectric material 54 is from 20 to 400 nm thick. For the specimens discussed below, the natural oxide 50 was 4.0 nm thick, the insulator 52 was 25.0 nm thick, the ferroelectric 54 was 380 nm thick, and the electrode 56 was 400 nm thick.

Figure 10:
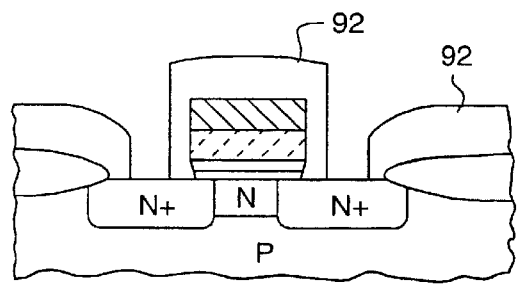
Figure 11:
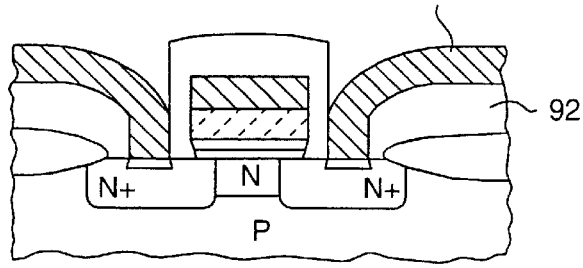
Figure 12:
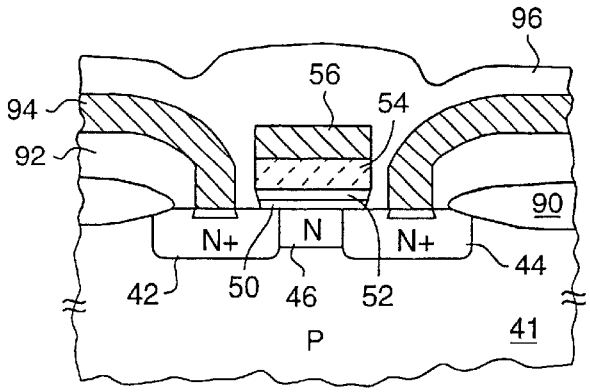

As shown in FIG. 10, an interlayer dielectric 92, preferably SOG (spin-on-glass), is formed in step 636, and then patterned in steps 637, 638, and 639 to form the holes for the source/drain contacts. The metallization is then deposited in step 644. The metallization is patterned in steps 646, 648, and 650, followed by another anneal, which is preferably performed at 800° C. for 30 minutes. In some embodiments, the back side or bottom of the wafer 41 is then metallized in step 660, preferably with an aluminum layer. The FET 40 and memory 800 (FIG. 38) is then completed with a conventional capping layer 96 and packaging in step 670.

3. Measured Electronic Parameters

Figure 13:
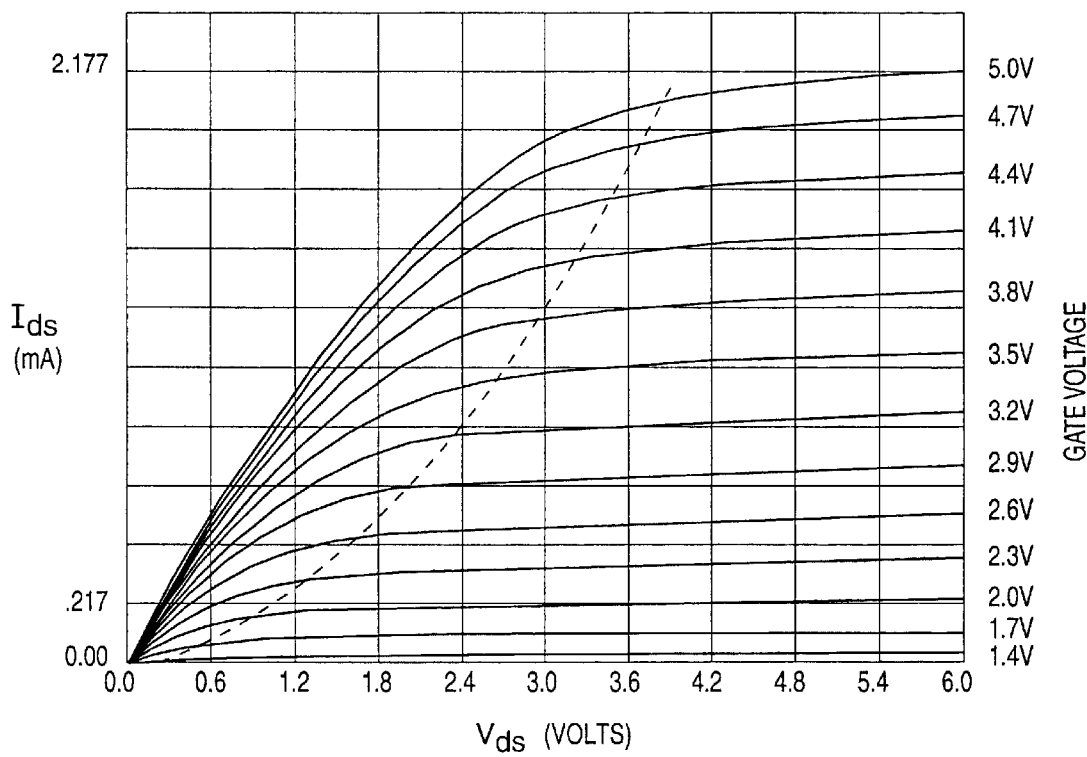
FIG. 13 is a graph of drain to source current verses drain voltage for various gate voltages measured for a ferroelectric FET according to the invention after a positive pulse was applied to the ferroelectric material.

Numerous examples of FETS fabricated as indicated above were tested with the results shown in FIGS. 13–27. FIG. 13 is a graph of drain to source current in milliamps (ma) verses drain to source voltage in volts for various gate voltages measured after a positive pulse was applied to the ferroelectric material. The positive pulse was a pulse of 5 ns rise time and 60 ns period whose amplitude was swept from zero to 4.53 volts while applying a D.C. gate bias voltage of 1.2 volts. The drain voltage was then swept from zero to six volts while applying various gate voltages from 5 volts to 0.5 volts, which are given in volts along the right hand side. The gate voltage was decreased in 0.3 volt steps. The dashed line indicates the locus of Ids(sat) versus Vd(sat) and thus separates the linear and saturation regions. In the linear region, Ids increases linearly with Vd for a given Vg. When the drain voltage is increased to a point such that the charge in the inversion layer becomes zero, the number of mobile electrons at the drain experiences a drastic fall-off. At this point, called the pinch-off, the drain current becomes saturated. The pinch-off point and the saturation current decreases as the gate voltage decreases. Though not shown in the figure, because of the scale, when the gate voltage dropped below the negative threshold voltage of 0.8V, the current dropped three orders of magnitude.

Figure 14:
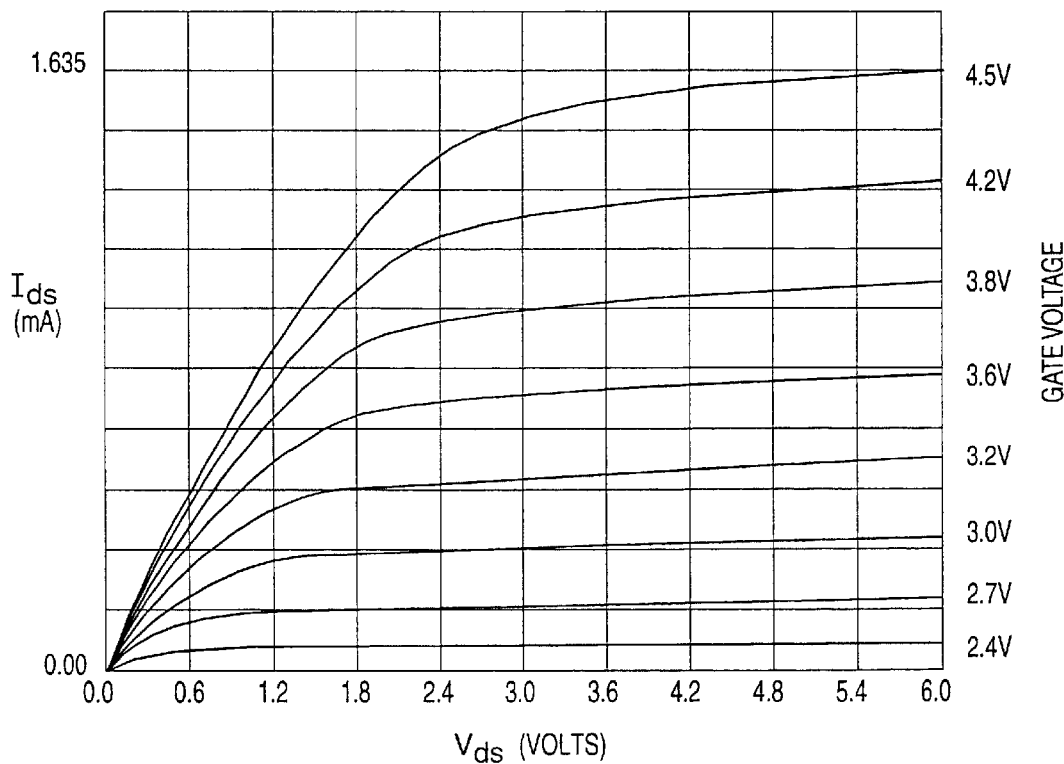
FIG. 14 is a graph of drain to source current version drain voltage for various gate voltages measured for a ferroelectric FET according to the invention after a negative pulse was applied to the ferroelectric material.
Figure 15:
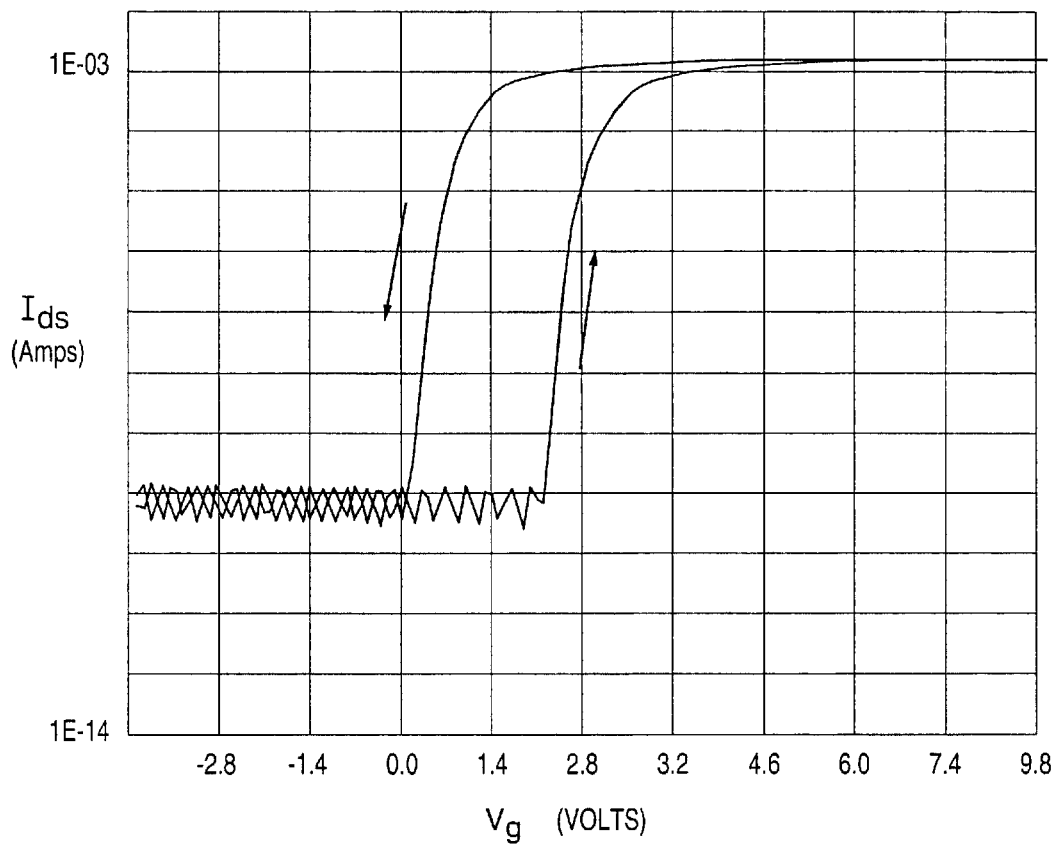
FIG. 15 is a graph of drain to source current versus gate voltage measured for a ferroelectric FET according to the invention.

FIG. 14 is a graph of drain to source current in milliamps versus drain voltage in volts for various gate voltages measured for a ferroelectric FET after a negative pulse was applied to the ferroelectric material. The negative pulse was a pulse of 5 ns rise time and 60 ns period whose amplitude was swept from zero volts to 6.56 volts while applying a D.C. gate bias voltage of 1.2 volts. The drain voltage was then swept from zero volts to six volts while applying various gate voltages, from zero volts to 4.5 volts, which are given in volts along the right hand side. The gate voltage was increased in 0.3 volt steps. Though not shown in the graph because of the scale, when the gate voltage was increased beyond the positive threshold voltage of 1.8 volts, Ids increased by three orders of magnitude, i.e. three decades. The memory window for this FET is shown in FIG. 15, which is a graph of drain to source current in amperes (Amps) versus gate voltage in volts. The D.C. gate bias was swept from −10 volts to +10 volts and back to generate this graph. The memory window is approximately 2.1 volts and the center of the window is at approximately one volt. The difference between the ON current and the OFF current is eight decades; thus these ON states are easily distinguishable.

Figure 16:
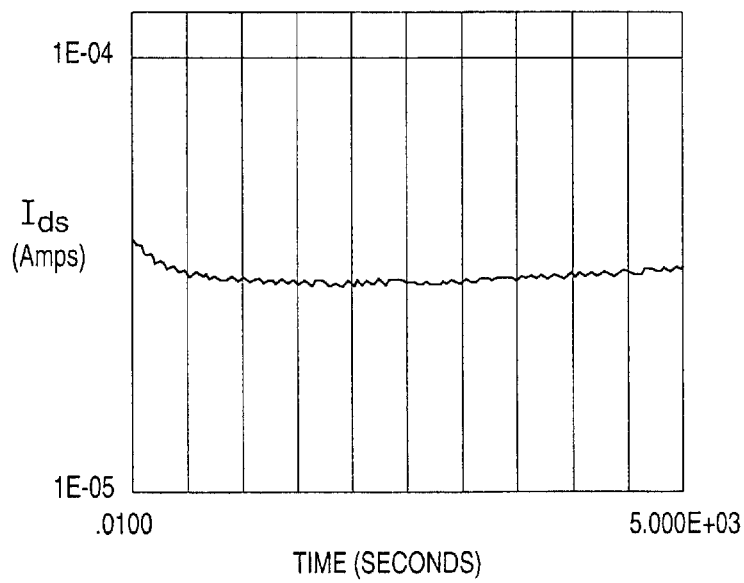
FIG. 16 is a graph of drain to source current versus time measured for a ferroelectric FET according to the invention after a positive pulse was applied to the gate and with a DC bias of 1.6 volts applied during the measurement.

FIG. 16 is a graph of drain to source current in amperes versus time in seconds measured for a ferroelectric FET according to the invention after a positive pulse of 4.5 volts was applied to the gate for two seconds. During the measurement, Vd was at one volt and D.C. bias of 1.6 volts was applied to the gate. After a 3% decay during the first two minutes, the source drain current remained essentially unchanged for 5000 seconds, or about 1.4 hours. Another measurement was made after 17 hours, and the source drain current was unchanged. Thus, this suggests that the data can be held essentially indefinitely.

In the above experiment, the gate bias was held at about 0.6 volts higher than the center of the memory window in FIG. 15. The reason for this is that the voltage pulse applied to program the FET was lower for the experiment of FIG. 16 than for the experiment of FIG. 15. The width of the memory window changes with the amplitude of the applied voltage pulse. The reason for this effect is not clear; the coercive voltage of the FET may be larger for a large signal than for a small signal.

Ideally, the center of the memory window should be at zero volts so that the stored signal will be kept indefinitely with no external power. The position of the memory window is sensitive to processing since it depends on the charge carriers in the silicon surface. Annealing in nitrogen moves the center of the memory window in the positive direction, while ion implantation with boron in the channel region 46 moves the center of the memory window in the negative direction. In the sample of FIGS. 15 and 16, the center of the memory window was at −0.3 volts prior to $N_2$ annealing but moved to +1.2 volts after $N_2$ annealing.

Figure 17:
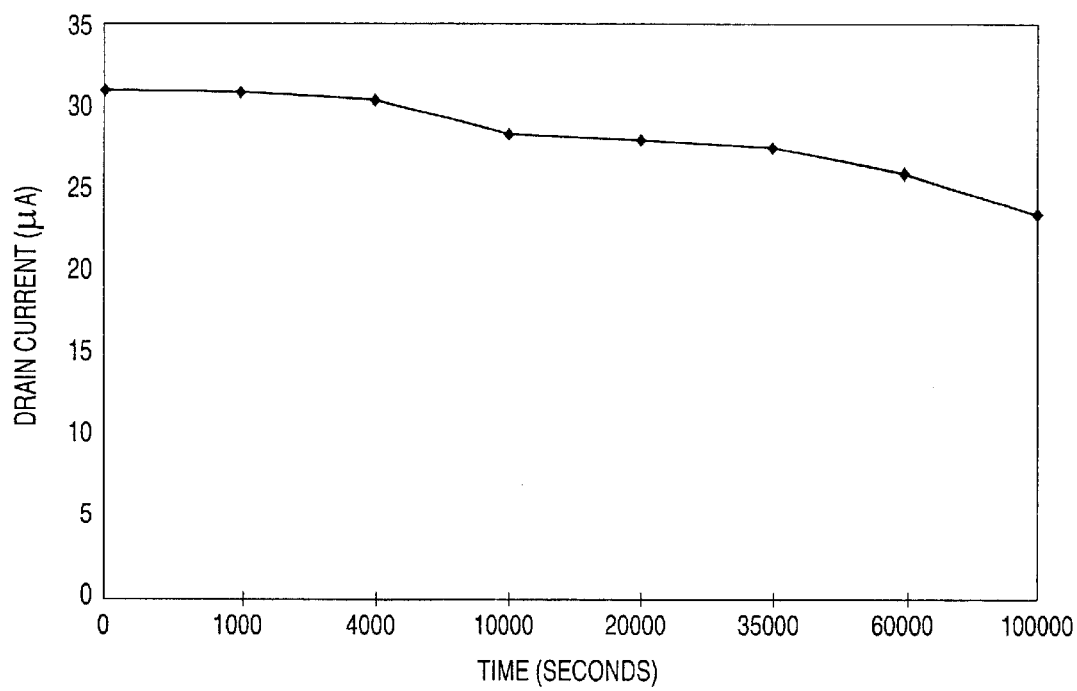
FIG. 17 is a graph of drain to source current versus time measured for a ferroelectric FET according to the invention after a positive pulse was applied to the gate and with a the gate open during the measurement.

FIG. 17 is a graph of drain to source current in microamps versus time in seconds measured for the ferroelectric FET sample of the above FIGS. after a positive pulse of five volts was applied to the gate and with the gate open during the measurement. In this instance, the drain current decays from an initial current of 31 microamps to 23.5 microamps after 100,000 seconds, or about 28 hours. This result appears to be due to a conductance decay in channel 46. Since for this sample and voltage pulse the ration of Ids(on) to Ids(off) is about ten decades, the FET can be read at least for $10^6$ seconds, or about ten days.

Figure 18:
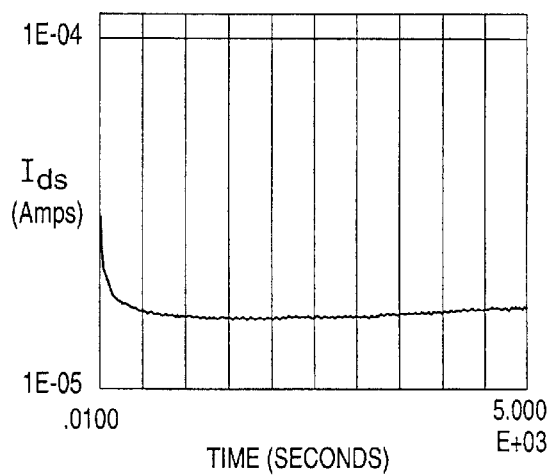
FIG. 18 is a graph of drain to source current versus time measured for a ferroelectric FET according to the invention after a negative pulse was applied to the gate, with a DC bias of 1.2 volts applied during the measurement, and with the FET illuminated with light.
Figure 19:
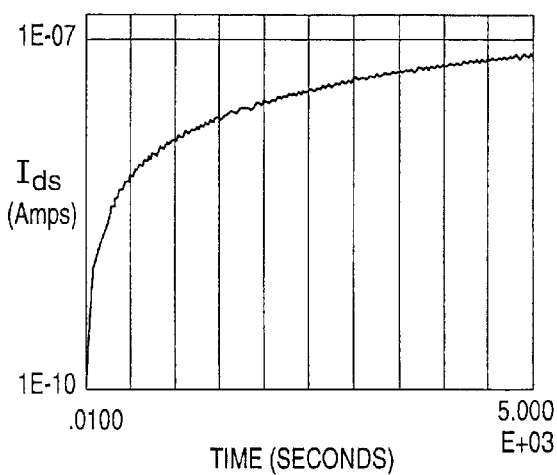
FIG. 19 is a graph of drain to source current versus time measured for a ferroelectric FET according to the invention after a positive pulse was applied to the gate, with a DC bias of 1.6 volts applied during the measurement, and with the FET illuminated with light.
Figure 20:
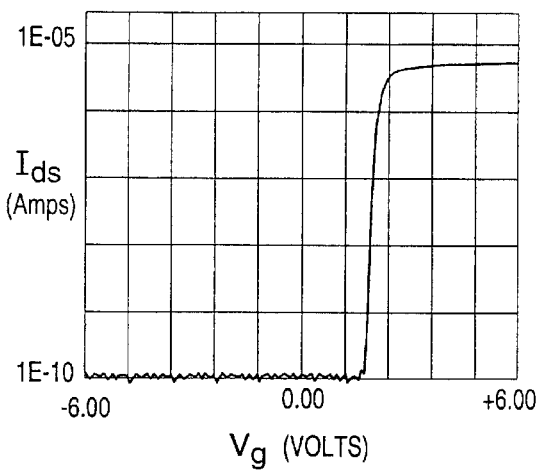
FIGS. 20–23 are graphs of drain to source current versus gate voltage when the gate voltage is swept from negative to positive for substrate biases of 0 volts, –2.0 volts, 0.3 volts, and 0.8 volts, respectively.
Figure 21:
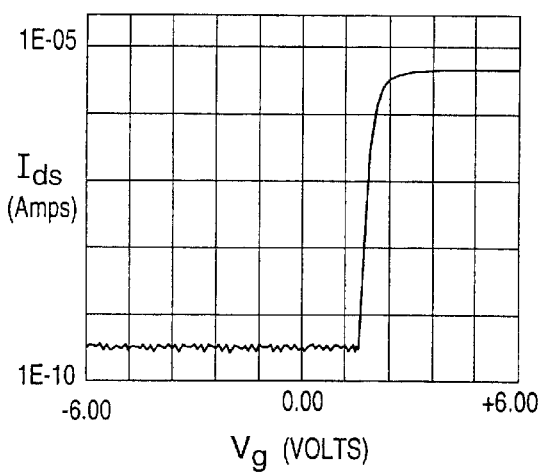

FIGS. 18 and 19 show the effect of light on the drain to source current of FET 40. FIG. 18 is a graph of drain to source current in amps versus time in seconds measured for a ferroelectric FET according to the invention after a positive pulse was applied to the gate, with a D.C. bias of 1.6 volts applied during the measurement, and with the FET illuminated with light; and FIG. 19 is a graph of drain to source current in amps versus time in seconds measured for a ferroelectric FET according to the invention after a negative pulse was applied to the gate, with a D.C. bias of 1.2 volts applied during the measurement, and with the FET illuminated with light. When the FET is in the ON state, that is, after the positive pulse, the drain to source current decreases exponentially about 30% after about 100 seconds and then is flat. When the FET is in the OFF state, that is, after the negative pulse, the drain to source current increases exponentially about three orders of magnitude after 5000 seconds. Thus, the memories should be capped to prevent any effect on performance due to illumination.

Figure 22:
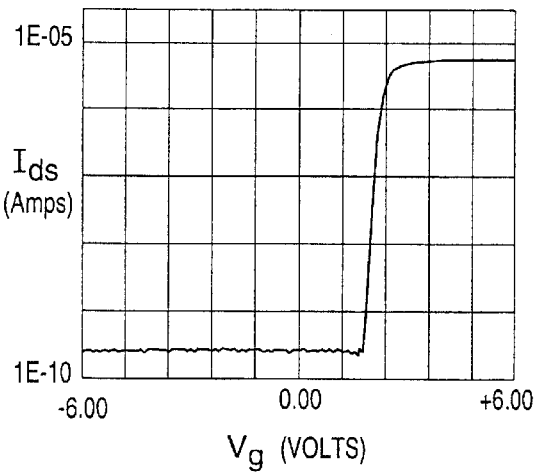
Figure 23:
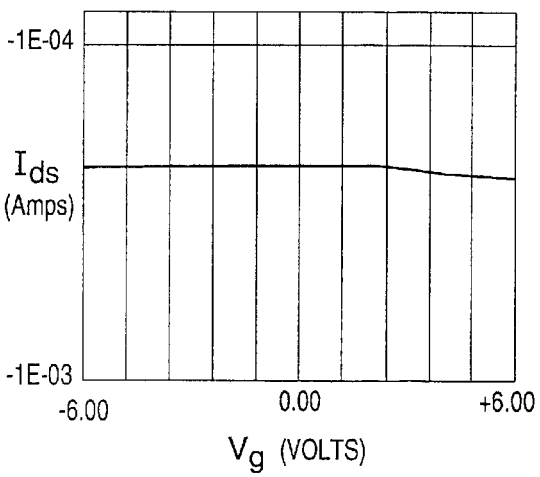
Figure 24:
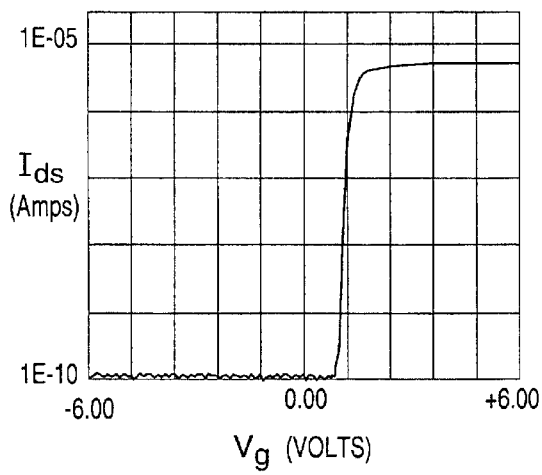
FIGS. 24–27 are graphs of drain to source current versus gate voltage when the gate voltage is swept from positive to negative for substrate biases of 0 volts, –2.0 volts, 0.3 volts, and 0.8 volts, respectively.
Figure 25:
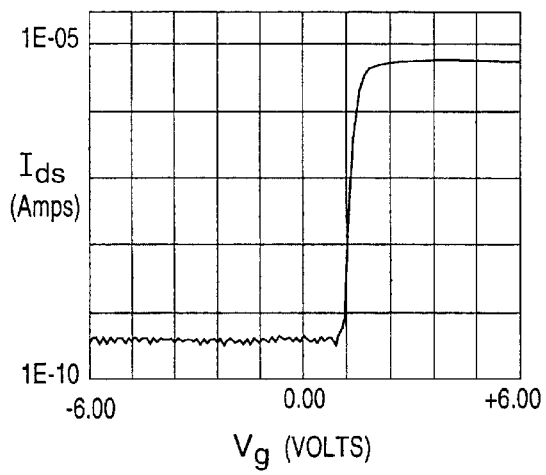
Figure 26:
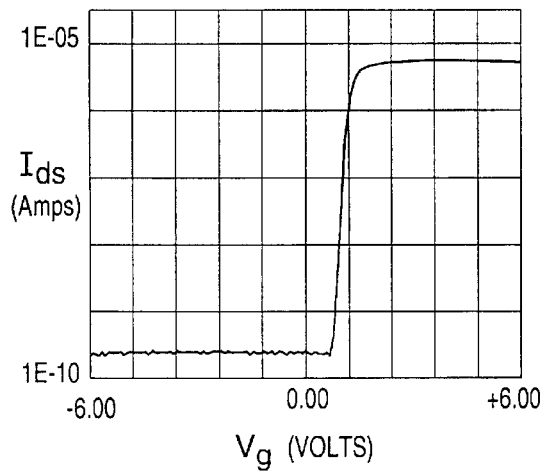
Figure 27:
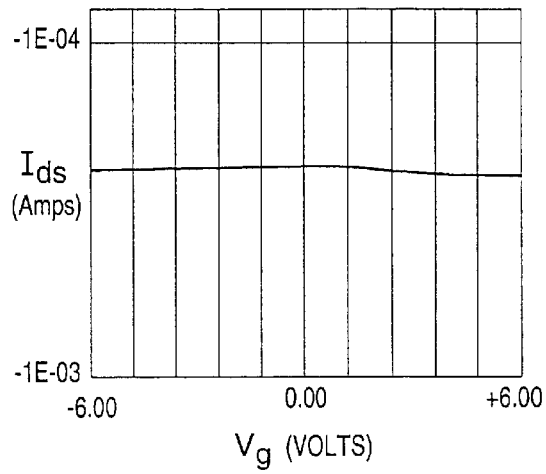

An important discovery of the invention is that the substrate bias strongly affects the drain to source current, the threshold voltages and the memory window. FIGS. 20–23 are graphs of drain to source current in amperes versus gate voltage in volts when the gate voltage is swept from a negative six volts to a positive six volts for substrate biases of zero volts, −2.0 volts, 0.3 volts, and 0.8 volts, respectively, and FIGS. 24–27 are graphs of drain to source current in amperes versus gate voltage in volts when the gate voltage is swept from a positive six volts to a negative six volts for substrate biases of zero volts, −2.0 volts, 0.3 volts, and 0.8 volts, respectively. When the gate voltage is swept from negative to positive (FIGS. 20–23), negative substrate bias results in the decrease of +Vth (FIG. 21) and small positive substrate bias results in the increase of +Vth (FIG. 22). When the gate voltage is swept from positive to negative (FIGS. 24–27), negative substrate bias results in the increase of −Vth (FIG. 25), and small positive substrate bias results in the decrease of −Vth (FIG. 26). In other words, positive substrate bias increases the memory window from 0.9 volts to 1.1 volts and negative substrate bias decreases the memory window from 0.9 volts to 0.6 volts. This effect should be much larger with increased channel doping. Importantly, when the positive substrate bias is over 0.6 volts, which is the minimum value of the surface potential, Ids becomes negative (FIGS. 23 and 27).

Based on the above, a truth table for writing to a memory 300 (FIG. 43) can be constructed. If Vss is the bias voltage between the substrate and the source, for the select line (Sub0, Sub1, etc.) applying the substrate bias voltage we can define a logic "0" state as the state in which Vss>0.8 volts and a logic "1" state as the state in which Vss<0.8 volts. Likewise, for the write/erase (W/E) signal applied to the word line (W0, W1, etc.), we can define a logic "0" as the state where Vg=−5 volts to −10 volts, and a logic "1" where Vg=+5 volts to +10 volts. Finally, we can define a resultant logic state for Ids as follows: we define the states where Ids is either negative or very small positive, i.e. of the order of nanoamps, as a logic "0"; we define the state were Ids is relatively large and positive, i.e. on the order of microamps to milliamps as the logic "1" state. The truth table, then, is as shown in Table 1.

TABLE 1

| Vss | W | Ids |
|---|---|---|
| 0 | 0 | 0 (<0) |
| 0 | 1 | 0 (<0) |
| 1 | 0 | 0 (>0, ~nA) |
| 1 | 1 | 1 (>0, $\mu$A − mA) |

The memory can be read by setting all voltages to zero except the drain voltage, and reading the drain current. If the drain current is negative or very small, i.e. in the range of microamps, then the state is a logic "0". If the drain current is positive and large, i.e. in the range of 0.01 milliamps or more, then the ferroelectric is in a logic "1".

3. Memory Architecture

Figure 28:
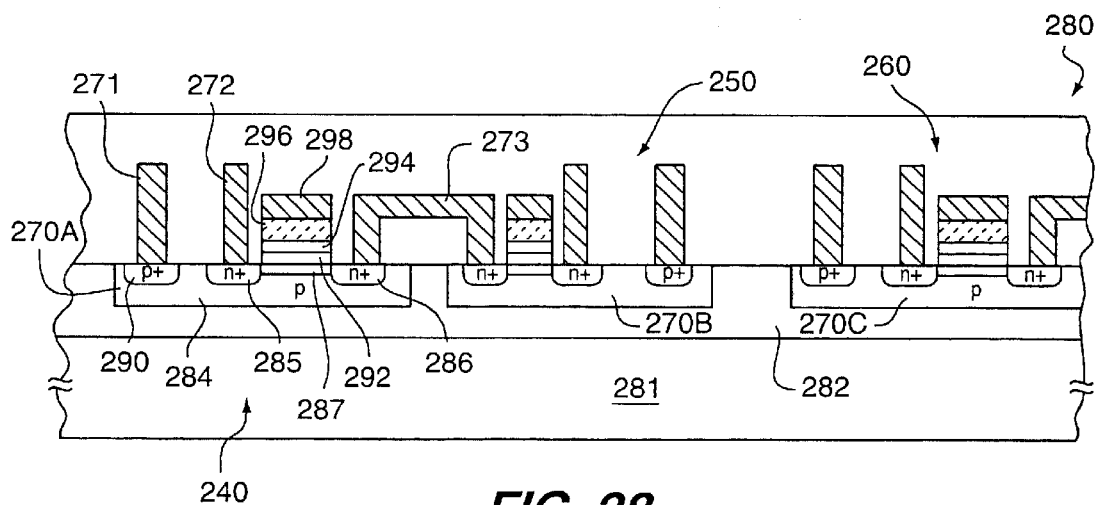
FIG. 28 is a cross-sectional view of a preferred embodiment of the ferroelectric memory according to the invention in which the source voltage is held to ground, a cell is written to by altering the substrate bias, and the substrate contact is located on the upper surface of the substrate.
Figure 29:
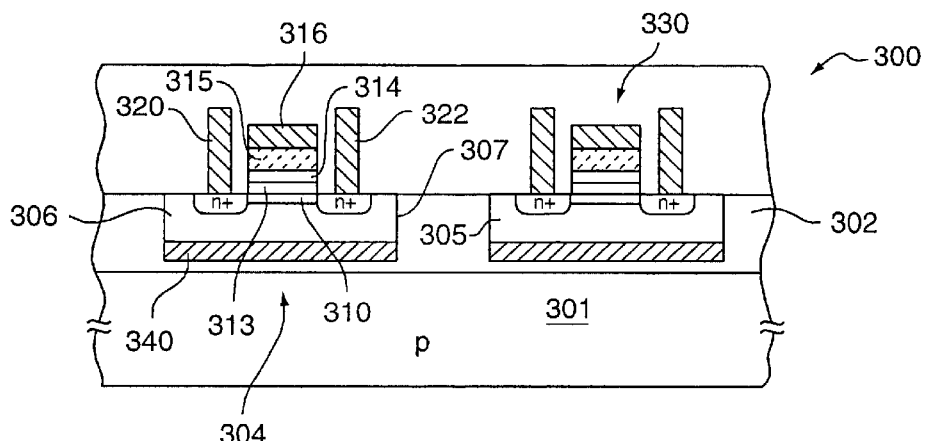
FIG. 29 is a cross-sectional view of a preferred embodiment of the ferroelectric memory according to the invention in which the substrate is held to ground, a cell is written to by altering the source bias instead of the substrate bias, and the substrate contact is located on the lower surface of the substrate.

The results discussed above show that the relative bias voltage between the substrate and source can be used to select and deselect a cell in an array of memory cells that utilize the FET 40. FIGS. 28 and 29 illustrate several alternative preferred embodiments of memories 280 and 300 according to the invention that utilized this feature of the invention. FIG. 28 is a cross-sectional view of an alternative preferred embodiment of a ferroelectric FET 280 according to the invention in which the substrate bias voltage is varied to select a cell or group of cells. Integrated circuit memory 280 is formed on a wafer 281 which is preferably p-type silicon. An insulation layer 282, preferably silicon oxide, is formed on wafer 281, and then wells, such as 270A, 270B and 270C are formed in the insulator 282. An epitaxial semiconductor 284, preferably epitaxial silicon, is formed in wells 270A, 270B and 270C. In and on each well 270A, 270B and 270C a FET, such as 240, 250 and 260, is fabricated. As discussed above, source/drains 285 and 286 and channel 287 are formed. In addition, a p+ doped area 290 is formed to be the contact region for the substrate 281. Then a natural oxide layer 292, an insulating layer 294, a ferroelectric layer 296 and an electrode 298 are formed as discussed above. Wiring layers 271, 272 and 273 are then formed to carry signals to the substrate contact area 290, source/drain 285 and source/drain 286. In this embodiment, all source/drain 286 is the source and all sources are held at the same voltage. So that one wiring layer portion 273 can serve two adjoining cells, the neighboring FET cell 250 is the mirror image of FET cell 240. In this embodiment, for each column of cells there is a complementary column that is read out at the same time, but using a different senses amp. The invention contemplates other embodiments in which the source wiring layers for adjoining cells are independent. In this embodiment, the substrate contact 271 is located on the upper surface of the substrate 284.

FIG. 29 shows a cross-sectional view of another alternative embodiment of a portion of a ferroelectric memory 300 according to the invention. In this embodiment, the substrate contact 340 is located on the lower surface of the substrate 306. In this embodiment, an insulator 302 is again formed on a wafer 301, and wells 307 are formed in the insulator 302. Substrate conductors 340 are deposited in the wells 302, then epitaxial semiconductor layers, such as layers 306 and 305 are formed in wells 307 and FETS, such as 304, 330 including source/drains 308, 309, channel 310, natural oxide 313, insulating layer 314, ferroelectric 315, and electrode 316, are formed in and on the epitaxial semiconductor substrates, such as 306 and 305, in the manner described above. Wiring layers 320 and 322 provide signals to the source/drains 308 and 309, respectively.

Other embodiments of the integrated circuit memory according to the invention are possible. The various features of the different embodiments can be combined in many ways. For example, in the embodiment of FIG. 28, a metallization layer could be put at the bottom of each well 270A 270B and 270C to serve as the substrate contact, rather than putting the contact on the surface of the epitaxial layer 284.

Figures 30, 31:
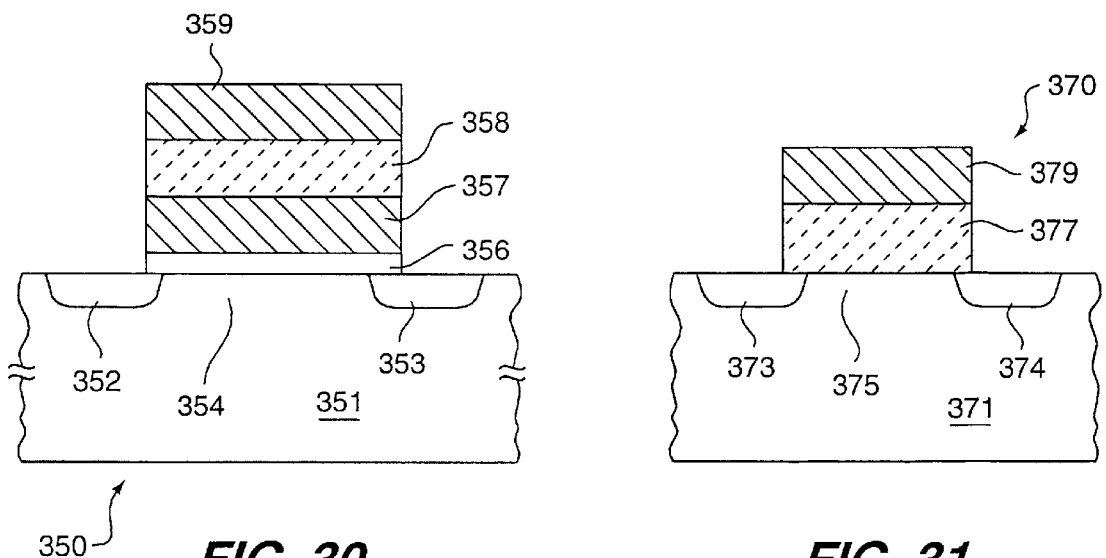
FIG. 30 illustrates a MFMISFET according to the invention.
FIG. 31 illustrates a MFSFET according to the invention.
Figure 32:
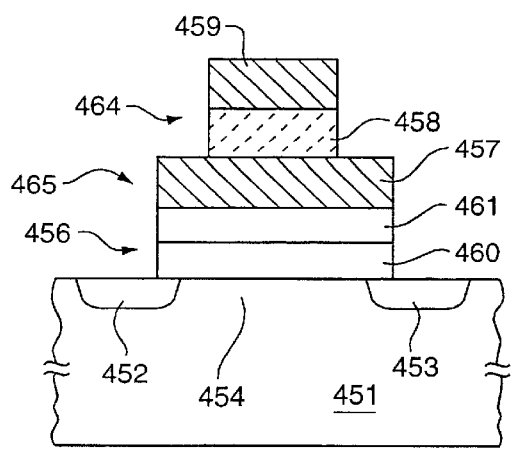
FIGS. 32–36 illustrate various embodiments of the gate structure of a ferroelectric FET according to the invention.
Figure 33:
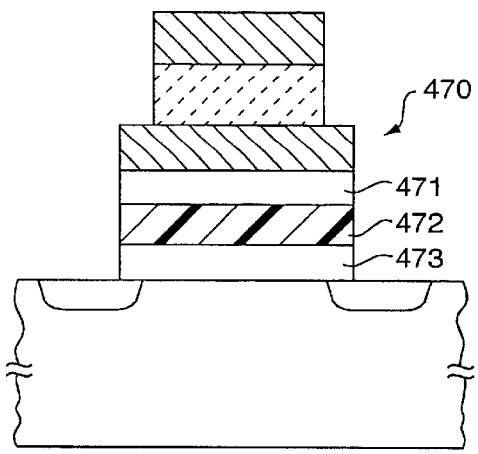

FIGS. 30 through 36 illustrate various gate configurations that can be combined with any of the different substrate configurations discussed above. The details of the substrate architecture is not shown in these FIGS. However, it should be understood that in the preferred embodiment they would include deep—and p-wells as shown in FIG. 1, in alternative embodiments they can have the substrate architecture of either FIGS. 28 or 29, and they can be combined with other substrate architectures as well. FIG. 30 shows a MFMISFET which can also serve as the FET to implement the invention. This FET is again formed on a semiconductor 351, and includes source/drains 352 and 353, channel 354, insulating layer 356, ferroelectric 358, and electrode 359, but also includes a floating gate electrode 357. Insulating layer 356 can be a single insulating layer or multiple insulating layers as discussed above. Contacts, wiring layers and other architecture can take on any of the forms shown or discussed above. FIG. 31 shows a MFSFET that can also serve as the FET to implement the invention. This FET is again formed on a semiconductor 371, and includes source/drains 373 and 374, channel 375, ferroelectric 377, and electrode 379, but does not include the additional insulating layers between the ferroelectric 377 and the semiconductor. Contacts, wiring layers and other architecture can take on any of the forms shown or discussed above. FIG. 32 shows a MFMISFET 450 similar to the MFMISFET 350 of FIG. 36, except that the insulating layer 456 includes a barrier layer 461 and an insulator layer 460. This FET is again formed on a semiconductor 451, and includes source/drains 452 and 453, channel 454, ferroelectric 458, electrode 459, and floating gate electrode 457. The barrier layer 461 is preferably iridium oxide (lrO$_2$), but may also be other suitable barrier materials also. In addition, The MFMISFET 450 illustrates another feature of the invention: the ferroelectric capacitor portion 464 has a smaller area then the capacitor portion 465 formed by conductor 457, insulator 456, and channel 454. Since capacitance is proportional to the area of the capacitor and the voltage drop across each of a number of capacitors connected in series is inversely proportional to the respective capacitances of the capacitors, this results in a larger portion of the total voltage drop across the FET being across the ferroelectric. This, in turn, permits the ferroelectric FET to operate at a lower voltage. This feature of making the ferroelectric capacitor, such as 464, smaller in area than the insulator capacitor, such 465, to create a larger voltage drop across the ferroelectric capacitor can be used in any of the embodiments of the invention disclosed herein. FIG. 33 shows a MFMISFET 470 similar to MISMISFET 450 in FIG. 32, except that this MFMISFET 470 includes a polysilicon layer 472 between barrier layer 471 and insulating layer 473. The polysilicon layer in this and other embodiments herein permits the FET to be fabricated with standard CMOS FET fabrication processes. These processes usually include a polysilicon deposition step, and the inclusion of the polysilicon into the FET architecture permits this step to be retained.

Figure 34:
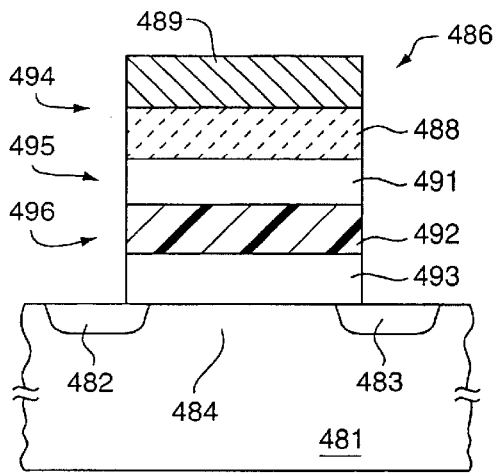
Figure 35:
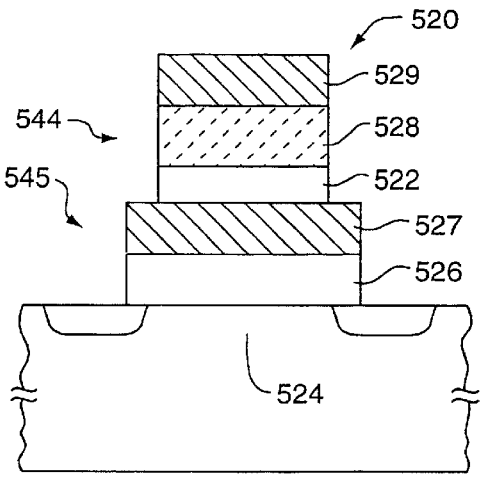
Figure 36:
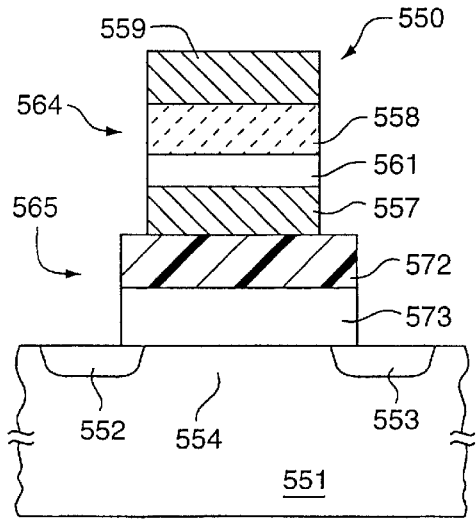

FIG. 34 shows a MFISFET 486 variation on the MFISFET of FIG. 1. This FET 486 is again formed on a semiconductor 481, and includes source/drains 482 and 483, channel 484, ferroelectric 488, electrode 489, and "insulator" 496. "Insulator" 496 includes barrier layer 491, polysilicon layer 492, and insulator 493. In this embodiment, the ferroelectric capacitor 494 is shown having essentially the same area as the insulator capacitor 495, though it is contemplated that the ferroelectric capacitor 495 could be made smaller in area as in the embodiments of FIGS. 32 and 33. FIG. 35 shows a MFMISFET 520 similar to MISMISFET 450 in FIG. 32, except that in this MFMISFET 520 includes the barrier layer 522 is located between ferroelectric layer 528 and electrode 527. In this embodiment, the ferroelectric capacitor 544 is shown to have a smaller area then insulator capacitor 545 formed by electrode 527, insulative layer 526 and channel 524, though it also could have the same area. FIG. 36 shows a MFMISFET 550 similar to MISMISFET 520 in FIG. 35, except that this MFMISFET 550 includes a polysilicon layer 572 between electrode 557 and insulating layer 573. This FET is again formed on a semiconductor 551, and includes source/drains 552 and 553, channel 554, barrier layer 561, ferroelectric 558, and electrode 559. Again, this embodiment is shown with insulator capacitor 565 formed by polysilicon layer 572, insulator 573, and channel 554, having a larger area then the ferroelectric capacitor 564. As a variation, the electrode 557 is shown having the area of ferroelectric capacitor 564, although it also could have the area of the insulator capacitor 565.

In any of the above embodiments, the barrier layer is preferably lrO$_2$. The insulator layer is preferably selected from: SiO$_2$, CeO$_2$, ZrO$_2$, Y$_2$O$_3$, YMnO$_2$, and SrTa$_2$O$_6$. If the insulator is SiO$_2$, its thickness is preferably 4 nanometers (nm) to 20 nm; If the insulator is CeO$_2$, its thickness is preferably 4 nanometers (nm) to 50 nm; If the insulator is ZrO$_2$, its thickness is preferably 4 nm to 50 nm; If the insulator is Y$_2$O$_3$, its thickness is preferably 4 nm to 50 nm; If the insulator is YMnO$_2$, its thickness is preferably 4 nm to 50 nm; And if the insulator is SrTa$_2$O$_6$, its thickness is preferably 4 nm to 50 nm.

It should be understood that the invention contemplates that any and all of the features of the various embodiments of ferroelectric FETs disclosed above can be combined with each other. That is, the embodiments shown are exemplary and have been chosen to illustrate the respective features, and are not intended to be limiting to the particular combinations shown.

Figure 37:
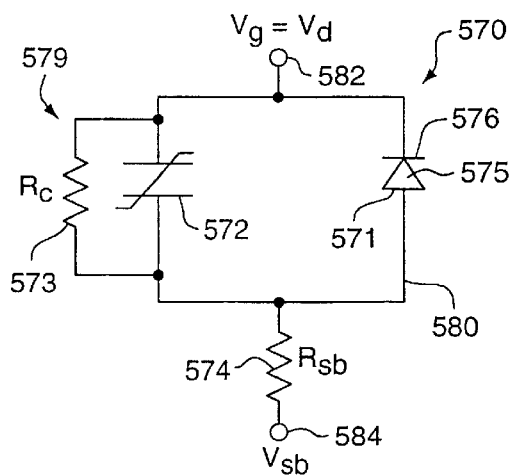
FIG. 37 shows an equivalent circuit for the FET of FIG. 1 when the same voltage is applied to the gate and drain.

FIG. 37 shows an equivalent circuit the FET 40 of FIG. 1 when the same voltage is applied to the gate and drain. Since the same voltage is applied to both the drain and the gate, the FET 40 can be considered being electrically equivalent to a circuit 570 including diode 575, capacitor 572, and resistors 673 and 574. Diode 575 is connected in parallel with a circuit 579 including resistor 573 and ferroelectric capacitor 572. The parallel circuits are connected between contact 582 representing both the gate contact 60 and the drain contact 64 and substrate contact 584, representing substrate contact 66, through is resistor 574. The resistance Rc of resistor 573 is the combined resistance of the layers 50, 52, 54 and 56. The capacitance of capacitor 572 includes both ferroelectric "capacitance" as well as the linear capacitance of the same stack. The resistance Rsb of resistor 574 is the resistance between contact 66 and channel 46. Diode 575 represents the pn junction between p-well 45 and drain 44. As is known in the art, such a junction creates a diode 575 having a cathode 576 at the n side and an anode 571 at the p side. Assuming that the logic "1" voltage is higher than the logic "0" voltage, if contact 584 is held at a logic "1", e.g., 5 volts, and contact 582 is held at a logic "0", e.g., zero volts, then diode 575 is forward biased, the diode 575 is "ON" and the voltage on node 580, i.e., in channel 46, is essentially the threshold voltage of the diode, which, for silicon, can range from about 0.5 volts to 0.7 volts. Again assuming that the logic "1" voltage is the high voltage and the logic "0" voltage is the low voltage, if contact 584 is held at a logic "0", and contact 582 is held at a logic "1", then diode 575 is reverse biased and the diode 575 is "OFF" and the circuit 570 is essentially a voltage divider. Generally, the resistance Rc is much greater than the resistance Rsb, so the voltage on node 580, i.e., channel 46, is very close to the voltage on contact 584, or zero volts.

In the examples of the forward biased and reverse biased diode discussed in the above paragraph, the voltage of the channel will be close to 0.5 volts. However, this is not the voltage across the ferroelectric 54 of the FET of FIG. 1, but rather is the voltage across the entire gate structure including the ferroelectric layer 54 and the insulator layers 50 and 52. That is, some voltage drop will occur across the insulator layers 50 and 52, and this must be subtracted from the total voltage drop of about 0.5 volts to obtain the voltage drop across the ferroelectric layer 54. Thus, the voltage drop across the ferroelectric material 54 depends on the relative capacitances of the ferroelectric material and the insulator layers. Generally, in a practical memory, about half the voltage drop will occur across the ferroelectric and about half across the insulator layers. Thus, with a channel voltage of about 0.5 volts and a gate voltage of zero volts, the ferroelectric material 54 will see an applied voltage of about 0.25 volts, which is too small to disturb the polarization of the ferroelectric. As will be seen below, the above facts are important to the ability of the invention to select cells using the substrate voltage.

Figure 38:
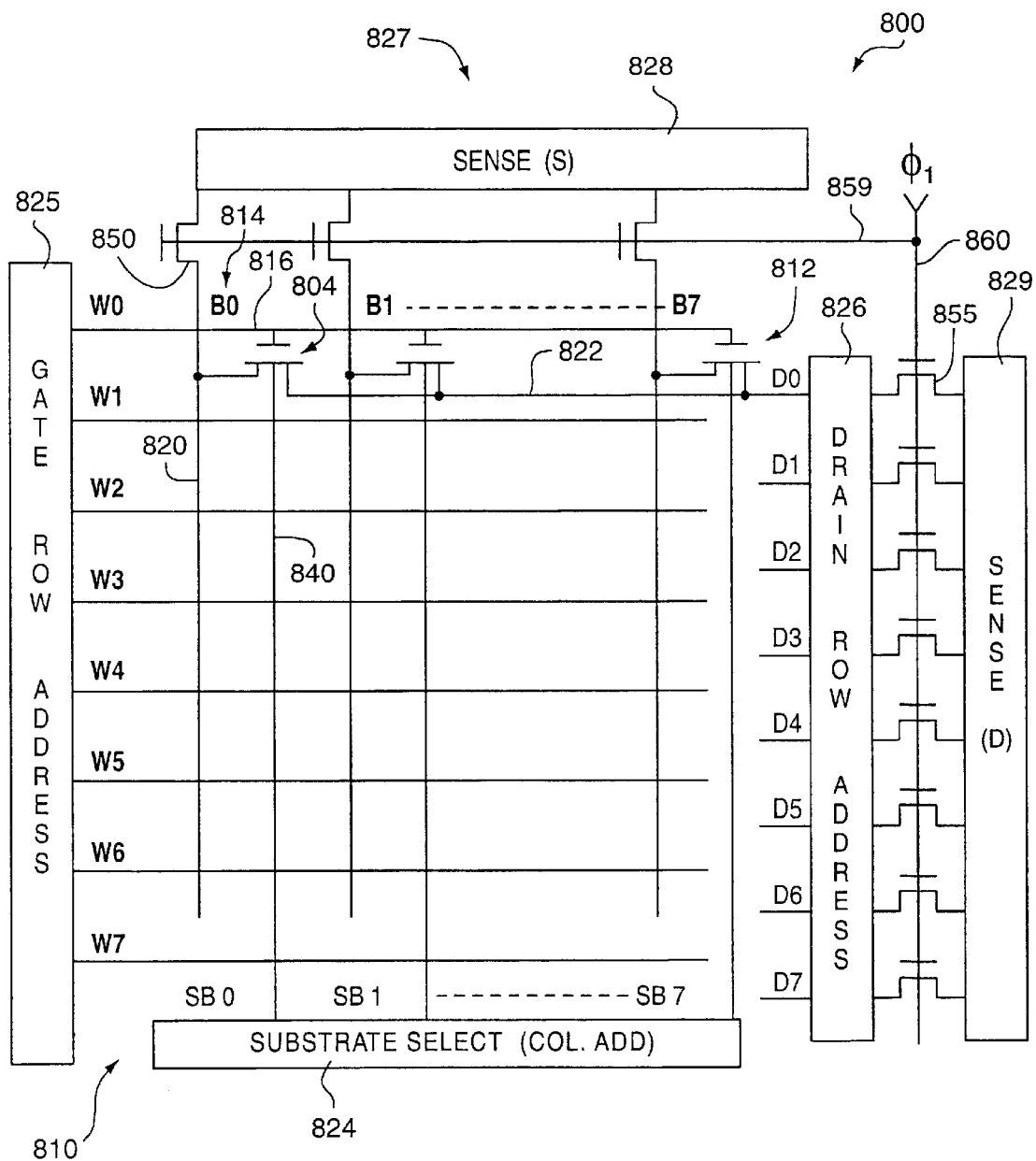
FIG. 38 shows a block electrical diagram of the preferred embodiment of a memory array according to the invention.

FIG. 38 shows a block electrical diagram of the preferred embodiment of a memory 800 utilizing the memory cell structure of FIG. 1. The memory 800 includes an array 810 of rows, such as 812, and columns, such as 814, of FET memory cells, such as 804. Cell 804 corresponds to the FET 40, word line 816 corresponds to gate electrode 56, line 820 corresponds to source contact 62, line 822 corresponds to drain contact 64, and substrate line 840 corresponds to substrate contact 66. Memory 800 also includes row address decoders 825 and 826, column address decoder 824, and sense amplifier 827 comprising column portion 828 and row portion 829. The row address decoder 825 is connected to the word lines W0, W1 . . . W7, with each of the eight word lines connected to all the gates of the FETs in a given row. The row address decoder 826 is connected to the drain lines D0, D1 . . . D7, with each of the eight drain lines connected to all the drains of the FETs in a given row. The column address decoder 424 is connected to the substrate lines, SB0, SB1 . . . SB7, with each of the eight substrate lines connected to the substrate of each FET in a given column. The sense amplifier portion 828 is connected to the lines B0, B1 . . . B7 through transistors, such as 850, with each of the eight lines B0, B1 . . . B7 connected to the source of each FET in a given column. The sense amplifier portion 829 is connected to the lines D0, D1 . . . D7 through transistors, such as 855. The invention contemplates many other embodiments related to the embodiment of FIG. 38. For example, the column address decoder could be connected to the gate of each FET in a column and the row address decoder could be connected to the drain of each FET in a row. The sense amplifier portion 828 and column address decoder 824 could be located on the same side of the array 810. For simplicity, the memory 800 shown is an 8×8 memory, that is a 64 bit memory; though, as known in the art, it can be made in much larger sizes.

Figure 39:
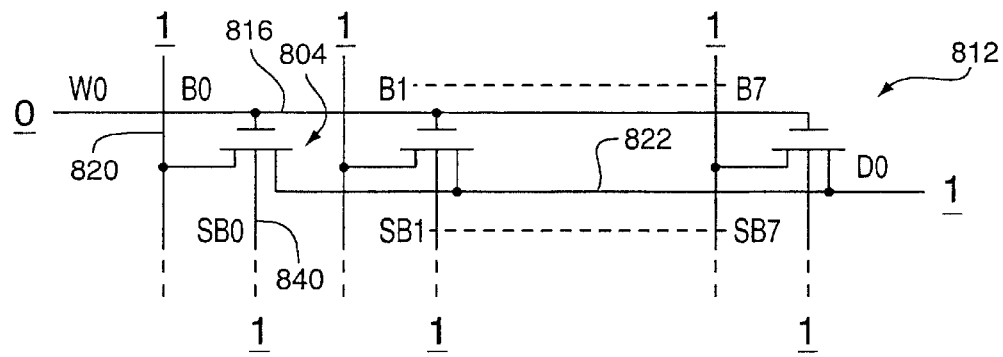
FIG. 39 illustrates the signals applied to the terminals of the selected row of ferroelectric FETs in the memory array of FIG. 38 when writing "0", i.e. resetting, the row.

An exemplary truth table that may be used for writing in parallel to memory 800 is shown in Table 2. In this preferred embodiment, all cells in a single row are addressed at the same time. That is, one byte is written to or read at the same time. The writing operation begins with a reset in which all cells in the row are set to a logic "0". This is done by: 1) holding the source and drain of the FET in each cell open, i.e., floating, or at a logic "1". The source may be held open by open circuiting the transistors, such as 850, by providing a high $\phi_1$ signal; 2) holding the gate of FET in each cell to a logic "0"; and 3) holding the substrate of the FET in each cell to a logic "1". This operation is shown in FIG. 39 for the zeroth row of the memory array 810. This operation polarizes each cell with a negative polarity toward the channel and a positive polarity toward the gate, which we define as a logic "0" state. The reset operation can be performed on all rows at the same time; that is, if it is desired to write to the entire array, the entire array can be reset to a logic "0" at the same time.

TABLE 2

| Operation | Cell | Source | Drain | Gate | Substrate | Result |
| --- | --- | --- | --- | --- | --- | --- |
| Write "0" (Reset) | All Cells | open or Logic "1" | open or Logic "1" | Logic "0" | Logic "1" | Logic "0" |
| Write "1" | 00 | open | Logic "1" | Logic "1" | Logic "0" | Logic "1" |

TABLE 2-continued

| Operation | Cell | Source | Drain | Gate | Substrate | Result |
|---|---|---|---|---|---|---|
| | 01 | open | Logic "1" | Logic "1" | Logic "1" | NC |
| | 10 | open | Logic "0" | Logic "0" | Logic "0" | NC |
| | 11 | open | Logic "0" | Logic "0" | Logic "1" | NC |

Figure 40:
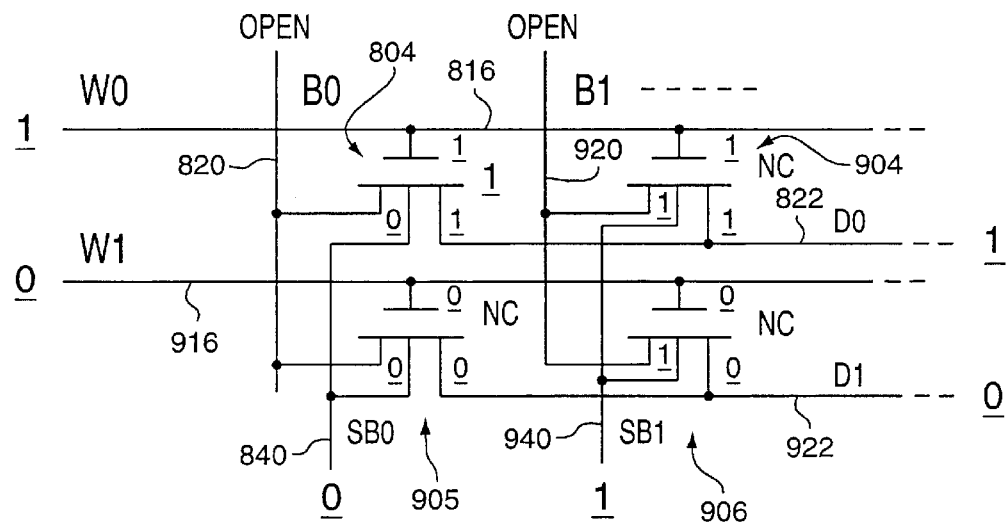
FIG. 40 illustrates the signals applied to the terminals of the selected and non-selected ferroelectric FETs in the memory array of FIG. 38 when writing "1" to a selected ferroelectric FET.

After the reset operation, the cells which are to contain a logic "1" are rewritten. In Table 2, the cells are identified by row and column; that is, the first of the two numerals in the "cell" box indicate the row, and the second of the two numerals indicate the column. The writing of a logic "1" to the first cell 804, i.e. the cell in the zeroth row and zeroth column is shown in FIG. 40 and is summarized in the writing "1" portion of Table 2. In cell 804 the gate and drain are at a logic "1", while the substrate is at a logic "0" and the source is open. Applying the operation of the equivalent circuit of FIG. 37 to this combination of voltages, the diode is reverse biased, which results in a high voltage on the gate with close to zero voltage in the channel. This polarizes the ferroelectric with a negative polarity toward the gate and a positive polarity toward the channel, which is the opposite of the logic "0" polarity, and which we therefore designate as a logic "1". The other cells in the same row and same column as cell 804 are unaffected. In cell 904, the gate, drain and substrate are all at the same voltage, which will pull the source, which is open, to the same voltage, and there is no effect on the ferroelectric, and the cell does not change. Likewise all voltages in cell 905 are the same, with the same result. In cell 906, the gate and drain are at a logic "0", while the substrate is at a logic 1. This results in a forward biased diode in the equivalent circuit of FIG. 37, with the result that the channel voltage is at or near the threshold voltage of the diode, i.e., from about 0.5 volts to 0.7 volts, and, as discussed above, the voltage drop across the ferroelectric material 54 is even lower. This low voltage is not enough to switch the ferroelectric, so again there is no change.

In the parallel write operation, all the cells in the row to which it is desired to write a logic "1" have their substrate set to logic "0", and the remainder have their substrate set to a logic "1". In this manner an entire row is written to at once.

The memory 800 can also be written to in serial or random access mode in which each cell is individually written to. An exemplary truth table that may be used for writing in serial to memory 800 is shown in Table 3.

will be pulled up to at or near a logic "1" by the substrate and drain voltages. Since the gate is at zero volts and the voltage of the channel is at or near the high voltage, the ferroelectric material will be polarized with a positive polarity toward the gate and a negative polarity toward the channel, which is the logic "0" polarity, and therefore a logic "0" is written to cell 804. The other cells in the same row and same column as cell 804 are unaffected. For example, in cell 904, the gate is at a logic "0" while the drain and substrate are at a logic "1". This results in a reverse biased diode in the equivalent circuit of FIG. 37, with the result that the diode is turned off and there is close to zero voltage in the channel. Thus, the voltage is applied across the ferroelectric material is not enough to change its polarization. In cell 905 the gate and drain are at a logic "0", while the substrate is at a logic 1. This results in a forward biased diode in the equivalent circuit of FIG. 37, with the result that the voltage in the channel is at or near the threshold voltage of the diode, i.e from about 0.5 volts to 0.7 volts. As discussed above, the voltage drop across the ferroelectric material 54 is even lower, and this low voltage is not enough to switch the ferroelectric, so again there is no change. In cell 906, the gate, drain and substrate are all at the same voltage, which will pull the source, which is open, to the same voltage, and there is no effect on the ferroelectric, and the cell does not change.

The cells are read by applying a logic "0" or a small positive voltage to all gates, a logic "0" voltage to all substrates, a 0.8 volt or higher voltage to the drain line of the row of the selected cell, and a zero voltage to the source line, B0, B1 etc., of the column to be written to. A zero voltage is applied to he drains of the non-selected rows, and a 0.8 volt voltage is applied to the sources of the non-selected columns. The selected cell is then read via sense amplifier 827. If the drain current is negative or very small, i.e. in the range of microamps, then the state is a logic "0". If the drain current is positive and large, i.e. in the range of 0.01 milliamps or more, then the ferroelectric is in a logic "1".

TABLE 3

| Operation | Cell | Source | Drain | Gate | Substrate | Result |
|---|---|---|---|---|---|---|
| Write "1" | 00 | open | Logic "1" | Logic "1" | Logic "0" | Logic "1" |
| | 01 | open | Logic "1" | Logic "1" | Logic "1" | NC |
| | 10 | open | Logic "0" | Logic "0" | Logic "0" | NC |
| | 11 | open | Logic "0" | Logic "0" | Logic "1" | NC |
| Write "0" | 00 | open | Logic "1" | Logic "0" | Logic "1" | Logic "0" |
| | 01 | open | Logic "1" | Logic "0" | Logic "0" | NC |
| | 10 | open | Logic "0" | Logic "0" | Logic "1" | NC |
| | 11 | open | Logic "0" | Logic "0" | Logic "0" | NC |

Figure 41:
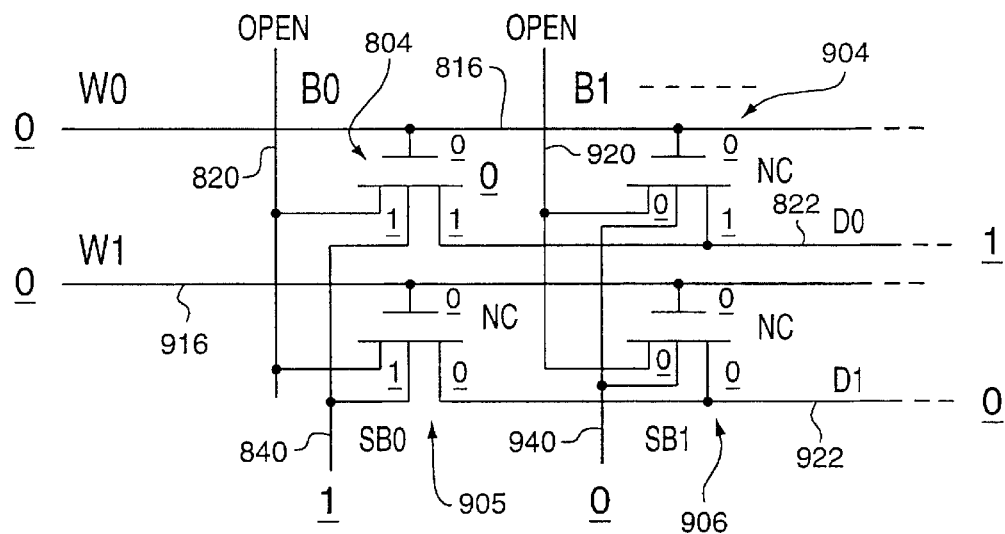
FIG. 41 illustrates the signals applied to the terminals of the selected and non-selected ferroelectric FETs in the memory array of FIG. 38 when writing "0" to a selected ferroelectric FET.

The write "1" operation is the same as for the cell 804 discussed in connection with the parallel writing operation and which is shown in FIG. 40. The effect of a write "0" operation on cell 804 is shown in FIG. 41. In cell 804 the gate is at a logic "0" and the drain is at a logic "1", while the substrate is at a logic "1" and the source is open. The source The higher current is utilized to pull a sense line in sense amplifier portion 829 down, which, as known in the art, causes the sense amplifier to output a logic "1" voltage.

Figure 42:
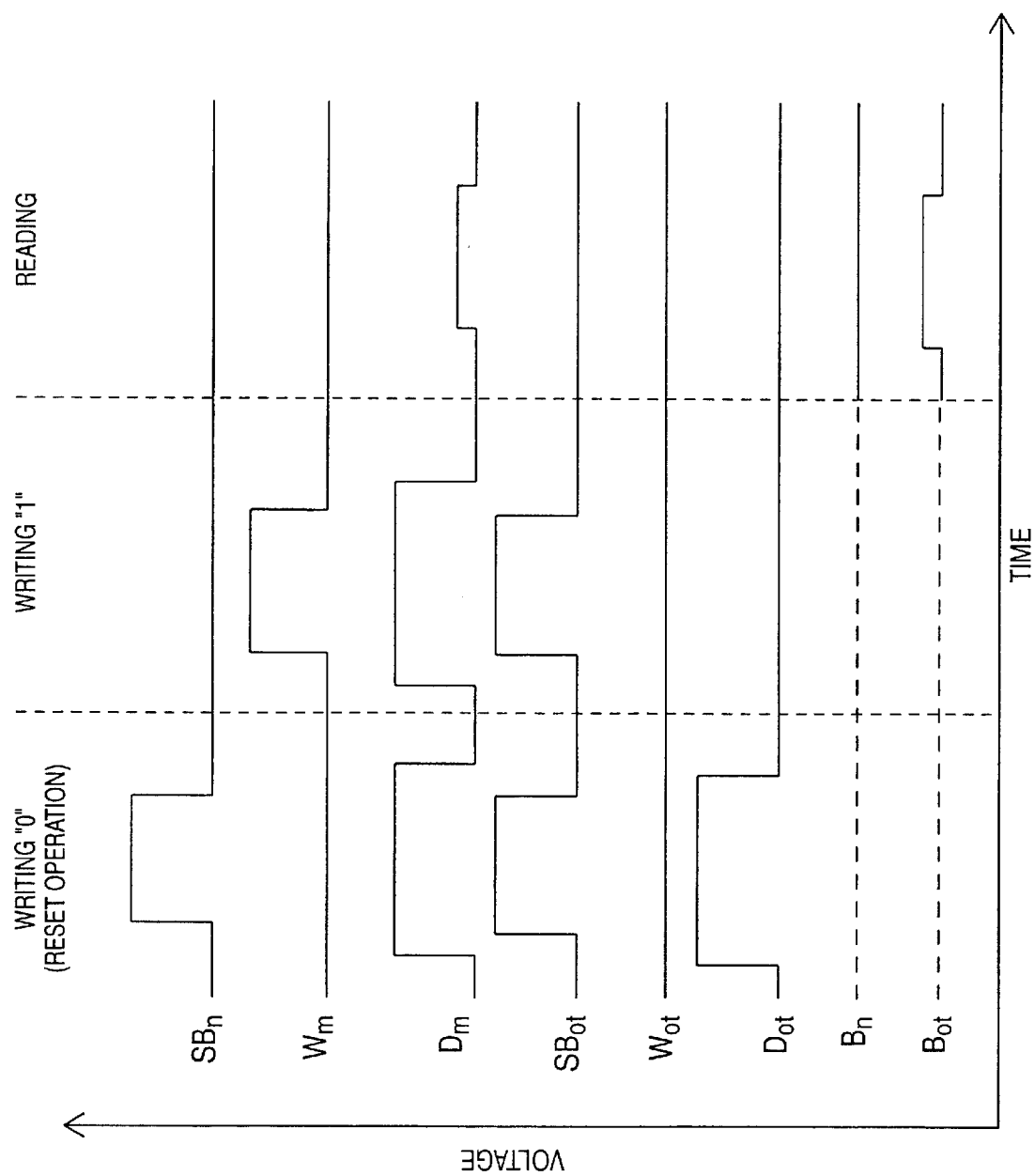
FIG. 42 shows a timing diagram for the memory array of FIG. 38.

FIG. 42 is a timing diagram for the memory 800. As conventional in the art, a timing diagram qualitatively illustrates the various voltage signals of interest in a memory.

That is, the figure is not intended to provide a precise indication of the voltages and times, but is only intended to provide a general indication of the operation of the memory. FIG. 42 shows the voltages applied to a selected cell in the mth row and nth column; that is, it shows the substrate voltage, $SB_n$, applied to the selected nth substrate line, the gate voltage, $W_m$, applied to the selected mth wordline, the drain voltage, $D_m$, applied to the selected mth drain line, and the source voltage, $B_n$, applied to the selected nth source line. It also shows the voltages applied to the non-selected lines. That is, it shows the substrate voltage, $SB_o$, applied to the substrate lines other than the selected substrate line, the gate voltage, $W_o$, applied to the wordlines other then the selected wordline, the drain voltage, $D_o$, applied to the drain lines other than the selected drain line, and the source voltage, $B_o$, applied to the source lines other than the selected source line. The dashed line for the source voltages indicates an open or floating state. All voltages are shown for the writing "0" operation, the writing "1" operation, and the reading operation. The voltages of the reset operation is the same as the writing "0" operation except that the voltages applied to the selected cell is applied to all the cells in a row, for a parallel write "0" operation that resets a whole byte, or is applied to all the cells in the array for a memory reset operation.

Figure 43:
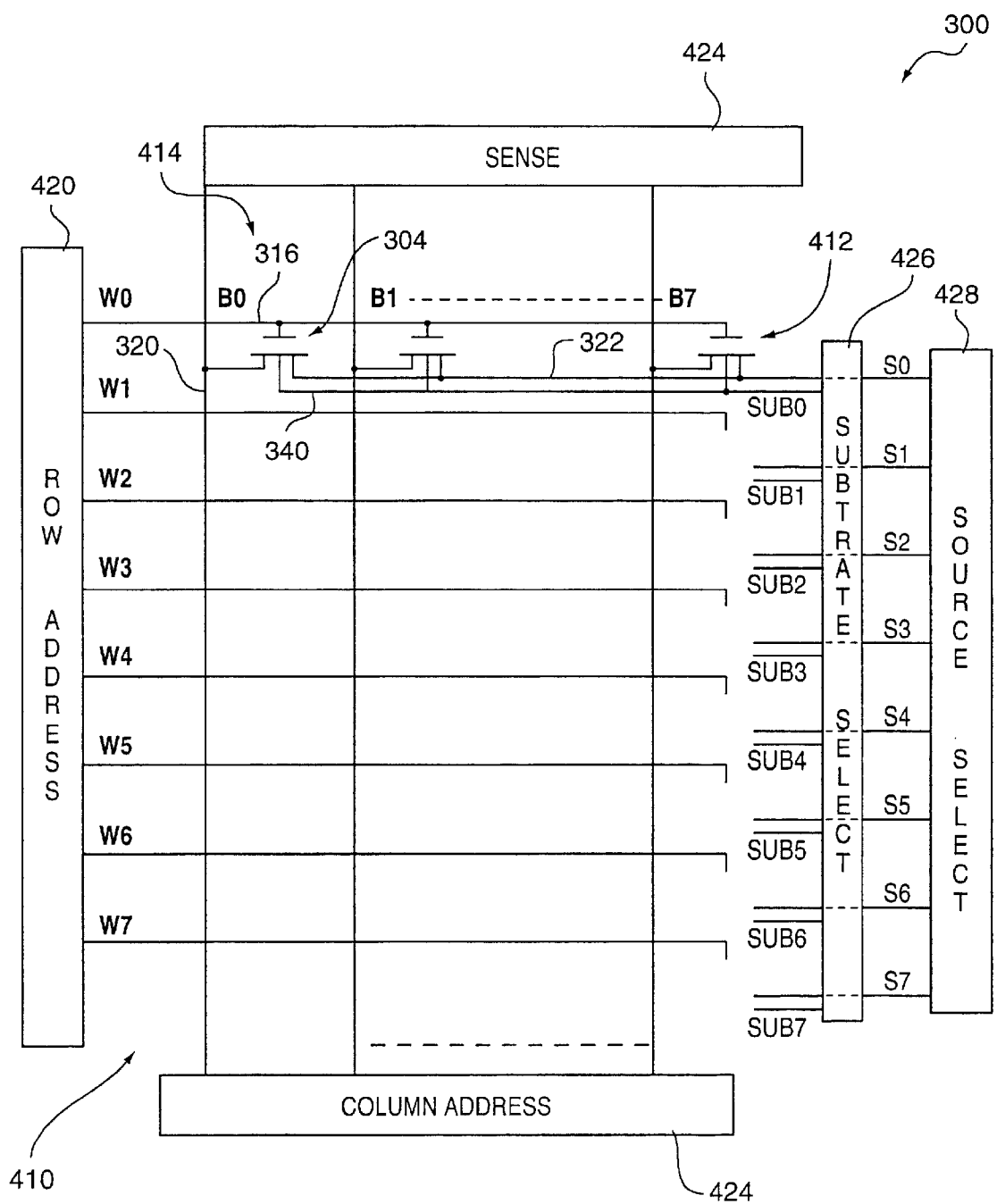
FIG. 43 shows a block electrical diagram of an alternative embodiment of a memory array according to the invention.

FIG. 43 shows a block electrical diagram of an alternative embodiment of a memory 300 utilizing the cell structure of FIG. 29. The memory 300 includes an array 410 of rows, such as 412, and columns, such as 414, of FET memory cells, such as 304. The cell 304 and lines 316, 320, 322, and 340 are numbered the same as in FIG. 29 for easy identification. Memory 300 also includes a row address decoder 420, a column address decoder 422, a sense amplifier 424, a substrate select circuit 426, and a source select circuit 428. The row address decoder is connected to the word lines W0, W1 . . . W7, with each of the eight word lines connected to all the gates of the FETs in a different row. The column address decoder 422 is connected to the bit lines, B0, B1 . . . B7, with each of the eight bit lines connected to the drain of each FET in a different column. The sense amplifier 424 is connected to the bit lines B0, B1 . . . B7 also. The substrate select circuit 426 is connected to the substrate select signal lines Sub0, Sub1 . . . Sub7. Each of the substrate select signal lines is connected to the substrate, such as 306, of each cell in a row. The source select circuit 428 is connected to the eight source select lines S0, S1 . . . S7. Each source select line is connected to the source, such as 309, of each cell in a row. The invention contemplates many other embodiments related to the embodiment of FIG. 32. For example, the column address decoder could be connected to the gate of each FET in a column and the row address decoder could be connected to the drain of each FET in a row. The sense amplifier could alternatively be connected to the source of each FET. The source select circuit 428 could alternatively have one line for each column and be located near the column address decoder 422. The sense amplifier 424 and column address decoder 422 could be located on the same side of the array 410. For simplicity, the memory 300 shown is an 8×8 memory, that is a 64 bit memory; though, as known in the art, it can be made in much larger sizes.

An exemplary truth table that may be used for writing to memory 300 is shown in Table 4. In the preferred embodiment, all cells in a single row are addressed at the same time. That is, one byte is written to or read at the same time. The writing operation begins with a reset in which all voltages are set to zero except the word line of the row to be written to, which is set to a negative voltage of from about −3 volts to −10 volts. This sets all cells to a logic "0". This operation is performed once just before the writing of data to a row. Then the row is written to by setting all source select lines, S1, S2 . . . S7, to a logic "1" i.e. a voltage of 0.8 volts. The word line of the selected row, say, W0, is set to a logic "1", that is, to a voltage of between +3 volts and +10 volts. The word line of the other rows, say W1 through W7, is set to a logic "0", that is, a voltage of zero volts. The substrate line, e.g. Sub0, of the row being written to is set to a logic "1", that is, a voltage of 0.8 volts, while the substrate lines of all the other rows, i.e. lines Sub1 through Sub7, are set to logic "0", i.e. zero volts. The drain voltages, that is, the bit line B0, B1 . . . B7 are then set to the desired logic state, either a logic "0", i.e. zero volts, or a logic "1", i.e. higher than 0.6 volts. A logic "1" is thus written to all the cells which have the bit line in the logic "1"state, and the other cells remain in the logic "0" state. For example, if in FIG. 32, B0, B2 and B4 are set equal to a logic "1", and B1, B3, B5, B6, and B7 are set to a logic "0", the data byte written to the row one is (10101000). A summary of these operations is shown in the form of a truth table in Table 4.

TABLE 4

| $V_S$ S | $V_B$ (Sub) | $V_G$ (W) | $V_D$ (B) | Data |
|---|---|---|---|---|
| 0 | 0 | 0 | 0 | (no change) |
| 0 | 0 | 0 | 1 | (no change) |
| 1 | 1 | 1 | 0 | 0 |
| 1 | 1 | 1 | 1 | 1 |

In the reading operation of memory 300, all the substrate voltages, Sub0, Sub1 . . . Sub7, are set to ground, and all the word line voltages, W0, W1 . . . W7, are set to a small positive voltage, such as 0.2 volts, or to ground, the bit lines are set to a logic "1", i.e. 0.8 volts, and the row to be read is selected by the source select circuit 428. The source select signal of the row to be read, say, S0, is set to zero volts, while the source select signals of all the other rows, say S1 . . . S7, are set to 0.8 volts. The state of the cells in the selected row is then read out by the sense amplifier 424 by reading the current on the bit lines B0, B1 . . . B7. In the "holding" state, all sources and all drains are set to a logic "1" or 0.8 volts.

Figure 44:
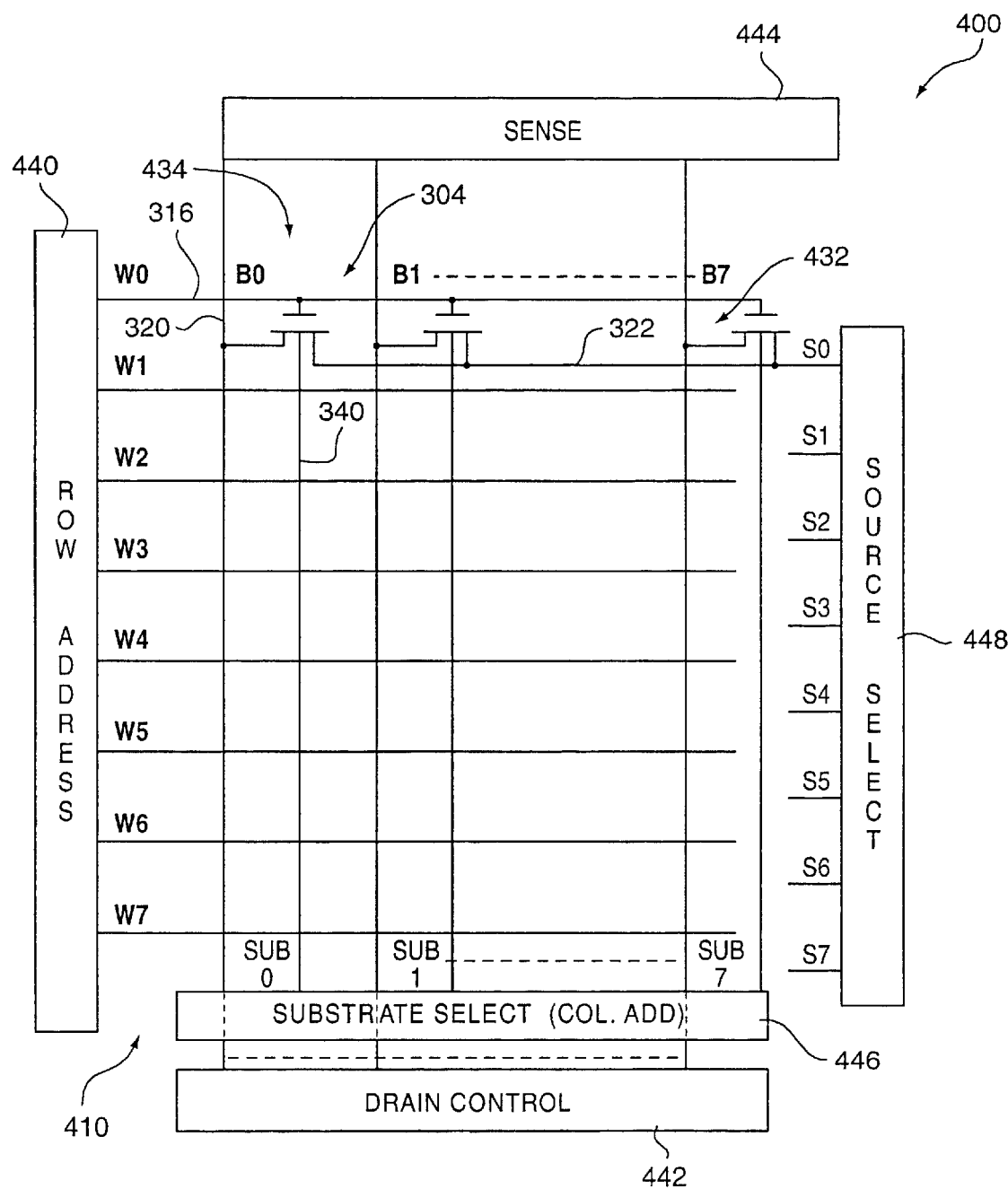
FIG. 44 shows a block electrical diagram of another alternative embodiment of a memory array according to the invention.

FIG. 44 shows a block electrical diagram of an another alternative memory 400 utilizing the cell structure of FIG. 29. The memory 400 includes an array 410 of rows, such as 432, and columns, such as 434, of FET memory cells, such as 304. The lines 316, 320, 322, and 340 are numbered the same as in FIG. 29 for easy identification. Memory 400 also includes a row address decoder 440, a drain control circuit 442, a sense amplifier 444, a substrate select circuit 446, and a source select circuit 448. The row address decoder is connected to the word lines W0, W1 . . . W7, with each of the eight word lines connected to all the gates of the FETs in a different row. The drain control circuit 422 is connected to the bit lines, B0, B1 . . . B7, with each of the eight bit lines connected to the drain of each FET in a different column. The sense amplifier 424 is connected to the bit lines B0 B1 . . . B7, also. The substrate select circuit 426 is connected to the substrate select signal lines Sub0, Sub1 . . . Sub7. Each of the substrate select signal lines is connected to the substrate, such as 306, of each cell in a row. The source select circuit 428 is connected to the eight source select lines S0, S1 . . . S7. Each source select line is connected to the source, such as 309, of each cell in a row. Again, the invention contemplates many other embodiments related to the embodiment of FIG. 33, and for simplicity, the memory 400 shown is an 8×8 memory, that is, a 64 bit memory; though, as known in the art, it can be made in much larger sizes.

An exemplary truth table that may be used for writing to memory 400 is shown in Table 5. Again, in the preferred embodiment, all cells in a single row are addressed at the same time. That is, one byte is written to or read at the same time. The writing operation begins with a reset operation that is identical to the reset operation described above for the embodiment of FIG. 32. Then the row is written to by setting all bit lines, B1, B2 . . . B7, to a logic "1", i.e. a voltage of 0.8 volts. The word line of the selected row, say, W0, is set to a logic "1", that is, to a voltage of between +3 volts and +10 volts. The word line of the other rows, say W1 through W7, is set to a logic "0", that is, a voltage of zero volts. The source select line, e.g. S0, of the row being written to is set to a logic "0", that is, a voltage of zero volts, while the source select lines of all the other rows, i.e. lines S1 through S7, are set to logic "1", i.e. 0.8 volts. The substrate voltages, that is, the lines Sub0, Sub1 . . . Sub7, are then set to the desired logic state, either a logic "0", i.e. a voltage greater than 0.6 volts, or a logic "1", i.e. a voltage less than 0.6 volts. A logic "1" is thus written to all the cells which have the substrate select signal line in the logic "1" state, and the other cells remain in the logic "0" state. For example, if in FIG. 33, Sub0, Sub2 and Sub4 are set equal to a logic "1" and Sub1, Sub3, Sub5, Sub6, and Sub7 are set to a logic "0", the data byte written to the row one is (01010111). A summary of these operations is shown in the form of a truth table in Table 5. In this truth table, we use a "−Vs" which is the inverse of Vs.

TABLE 5

| −Vs S | $V_B$ (Sub) | $V_G$ (W) | $V_D$ (B) | Data |
|---|---|---|---|---|
| 0 | 0 | 0 | 1 | (no change) |
| 0 | 1 | 0 | 1 | (no change) |
| 1 | 0 | 1 | 1 | 0 |
| 1 | 1 | 1 | 1 | 1 |

The reading operation of memory 400 and the holding operation are the same as described above for the memory 300.

There have been described what are at present considered to be the preferred embodiments of the invention. It will be understood that the invention can be embodied in other specific forms without departing from its spirit or essential characteristics. For example, while the invention has been described in terms of a silicon substrate, other substrates, such as gallium arsenide, germanium, silicon germanium, and other substrates may be used. Some of these substrates may have particular advantages over silicon. For example, it is known that germanium has a lower pn junction threshold voltage than silicon, the threshold voltage of germanium generally being about 0.2 volts to 0.3 volts. This would result in a lower "disturb" voltage in, for example, cell 906 with the applied voltages of FIG. 40 and cell 905 with the applied voltages of FIG. 41. Further, now that the possibility and advantages of utilizing a bias voltage to select memory cells has been shown, many modifications and variations of this principle may be devised. The present embodiments are, therefore, to be considered as illustrative and not restrictive. The scope of the invention is indicated by the appended claims.

We claim:

1. A method of writing to a selected memory cell in a ferroelectric memory, said memory including a plurality of memory cells each containing a ferroelectric FET, each of said ferroelectric FETs including the following electrical elements: a substrate, a source, a drain, a channel, a gate, and a layer of ferroelectric material; said ferroelectric FETs arranged in an array comprising a plurality of rows and a plurality of columns of said ferroelectric FETs, said memory further including a plurality of first row lines, each of said first row lines running parallel to one of said rows of said ferroelectric FETs, a plurality of second row lines, each of said second row lines running parallel to one of said rows of said ferroelectric FETs, and a plurality of column lines, each of said column lines running parallel to one of said columns of ferroelectric FETs, said method comprising placing a first voltage on the one of said row lines running parallel to the one of said rows containing said selected memory cell, placing a second voltage on the one of said columns running parallel to said selected memory cell, applying a third voltage on the one of said second row lines running parallel to said row containing said selected memory cell, applying said first voltage to a first one of said electrical elements in each of said ferroelectric FETs in said row containing said selected memory cell, applying said second voltage to a second one of said electrical elements in each of said ferroelectric FETs in said column containing said selected memory cell, and applying said third voltage to a third one of said electrical elements in each of said ferroelectric FETs in said row containing said selected memory cell.

2. A method as in claim 1 wherein said first electrical element is the source of said FETs.

3. A method as in claim 1 wherein said first electrical element is the substrate of said FETs.

4. A method as in claim 1 wherein said first electrical element is the drain of said FETs.

5. A method as in claim 1 wherein said second electrical element is the source of said FETs.

6. A method as in claim 1 wherein said second electrical element is the substrate of said FETs.

7. A method as in claim 1 wherein said second electrical element is the gate of said FETs.

8. A method as in claim 1 wherein said second electrical element is the drain of said FETs.

9. A method as in claim 1 wherein said second electrical element is the gate of said FETs.

10. A method as in claim 1 wherein said first electrical element is the gate of said FETs.

11. A method as in claim 10 wherein said second electrical element is the substrate of said FETs.

12. A method as in claim 1 wherein said third electrical element is the drain of said FETs.

13. A ferroelectric memorym said memory including a plurality of memory cells each containing a ferroelectric FET, each of said ferroelectric FETs including the following electrical elements: a substrate, a source, a drain, a channel, a gate, and a layer of ferroelectric material; said ferroelectric FETs arranged in an array comprising a plurality of rows and a plurality of columns of said ferroelectric FETs, said memory further including a plurality of first row lines, each of said first row lines running parallel to one of said rows of said ferroelectric FETs, a plurality of second row lines, each of said second row lines running parrallel to one of said rows of said ferroelectric FETS, and a plurality of column lines, each of said column lines running parallel to one of said columns of ferroelectric FETs, each of said first row lines electrically connected to a first one of said electrical elements in one of said rows of ferroelectric FETs, each of said column lines electrically connected to a second one of said electrical elements in one of said columns of ferroelectric FETs, and each of said second row lines electrically connected to a third one of said electrical elements in one of said rows of ferroelectric FETs.

14. A ferroelectric memory as in claim 13 wherein said first electrical element is the source of said FETs.

15. A ferroelectric memory as in claim 13 wherein said first electrical element is the substrate of said FETs.

16. A ferroelectric memory as in claim 13 wherein said first electrical element is the drain of said FETs.

17. A ferroelectric memory as in claim 13 wherein said second electrical element is the source of said FETs.

18. A ferroelectric memory as in claim 13 wherein said second electrical element is the substrate of said FETs.

19. A ferroelectric memory as in claim 13 wherein said second electrical element is the gate of said FETs.

20. A ferroelectric memory as in claim 13 wherein said second electrical element is the drain of said FETs.

21. A ferroelectric memory as in claim 13 wherein said second electrical element is the gate of said FETs.

22. A ferroelectric memory as in claim 13 wherein said first electrical element is the gate of said FETs.

23. A ferroelectric memory as in claim 22 wherein said second electrical element is the substrate of said FETs.

24. A ferroelectric memory as in claim 13 wherein said third electrical element is the drain of said FETs.

\* \* \* \* \*